(12) United States Patent
Nuytkens et al.

(10) Patent No.: US 6,552,555 B1
(45) Date of Patent: Apr. 22, 2003

(54) INTEGRATED CIRCUIT TESTING APPARATUS

(75) Inventors: Peter R. Nuytkens, Melrose, MA (US); Lev Bromberg, Swampscott, MA (US); Patrick G. Dannen, Boston, MA (US); Andrew D. Miller, Natick, MA (US); Ahmed Mitwalli, Cambridge, MA (US); Robert A. Most, Mendham, NJ (US)

(73) Assignee: Custom One Design, Inc., Melrose, MA (US)

(*) Notice: Subject to any disclaimer, the term of this patent is extended or adjusted under 35 U.S.C. 154(b) by 0 days.

(21) Appl. No.: 09/443,849

(22) Filed: Nov. 19, 1999

Related U.S. Application Data

(60) Provisional application No. 60/115,269, filed on Jan. 8, 1999, and provisional application No. 60/109,063, filed on Nov. 19, 1998.

(51) Int. Cl.[7] .............................................. G01R 31/02
(52) U.S. Cl. ....................................... 324/754; 324/755
(58) Field of Search ................................. 324/754, 755, 324/761, 763, 765, 757, 760, 758; 439/482, 86

(56) References Cited

U.S. PATENT DOCUMENTS

| 4,906,920 A | | 3/1990 | Huff et al. ................ 324/158 P |
| 5,422,574 A | * | 6/1995 | Kister ........................ 324/754 |
| 6,064,217 A | * | 5/2000 | Smith ......................... 324/758 |

* cited by examiner

*Primary Examiner*—N. Le
*Assistant Examiner*—James Kerveros
(74) *Attorney, Agent, or Firm*—Perkins, Smith & Cohen, LLP; Jacob N. Erlich; Jerry Cohen

(57) ABSTRACT

An integrated circuit testing apparatus includes a probe card and a probe unit. The probe unit includes a plurality of conductive elastic bumps and a plurality of conductors positioned to conduct signals from the bumps to the probe card. The testing apparatus can further includes a substrate disposed between the probe card and the probe unit, and a flexible member disposed adjacent the substrate.

29 Claims, 20 Drawing Sheets

| | | | Conductivity (s/cm) |
|---|---|---|---|
| FIG. 6a | 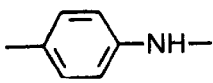 | HCl | 20 |
| FIG. 6b | 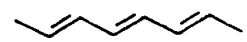 | I$_2$, Br$_2$, Li, Na | $10^4$ |
| FIG. 6c | 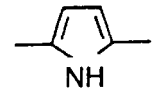 | BF$_4^-$, ClO$_4^-$, tosylate | 500-7500 |
| FIG. 6d | 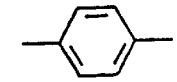 | AsF$_5$, Li, K | $10^3$ |
| FIG. 6e | 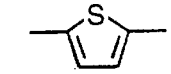 | BF$_4^-$, ClO$_4^-$, FeCl$_4^-$ | $10^3$ |
| FIG. 6f | 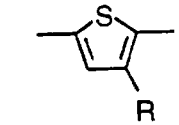 | BF$_4^-$, ClO$_4^-$, FeCl$_4^-$ | $10^3$-$10^4$ |

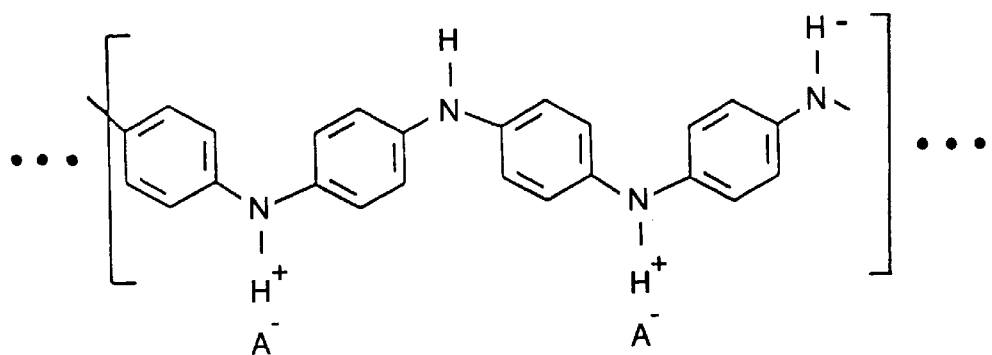
FIG. 7
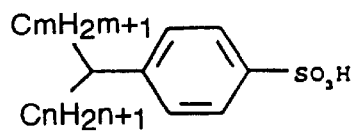
m+n+1=10...14
Dodecylbenzenesulfonic acid
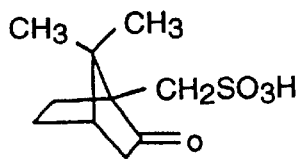
10-Camphorsulfonic acid
FIG. 8

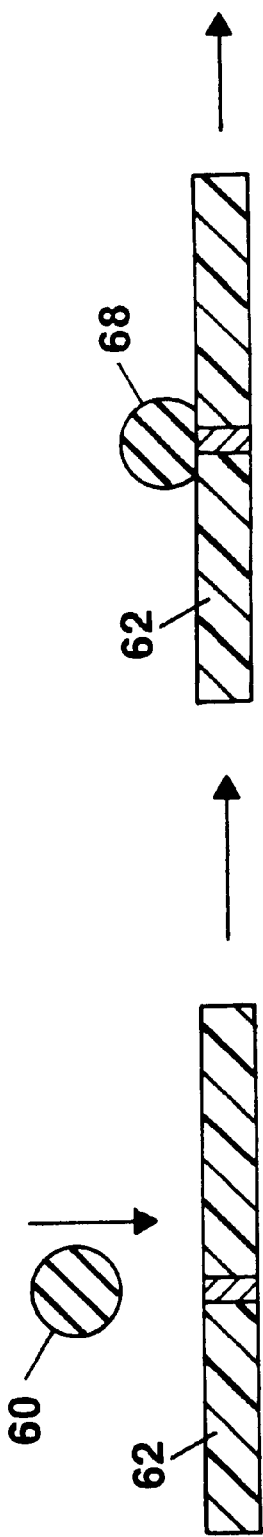
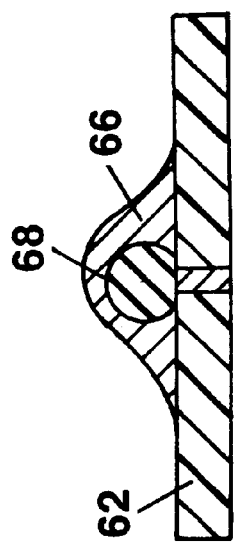
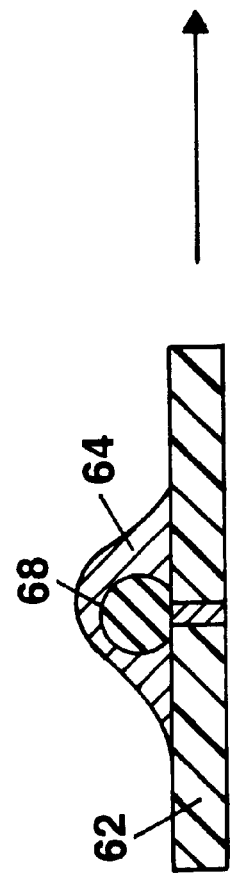
FIG. 9a
FIG. 9b
FIG. 9c
FIG. 9d

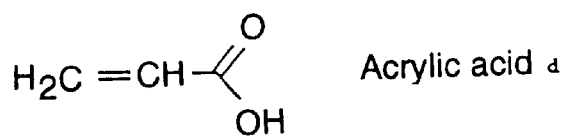 Acrylic acid
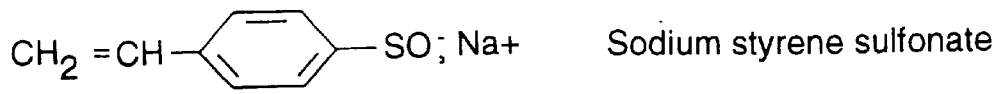 Sodium styrene sulfonate
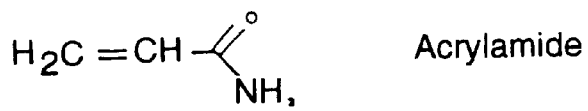 Acrylamide
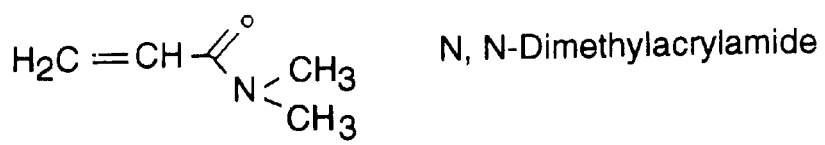 N, N-Dimethylacrylamide
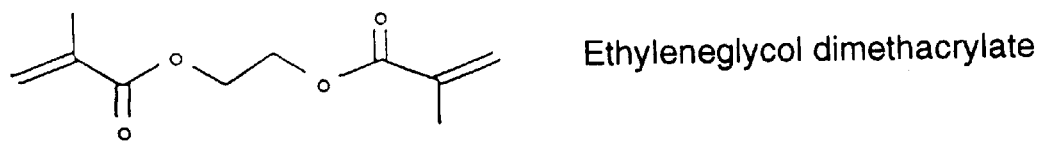 Ethyleneglycol dimethacrylate
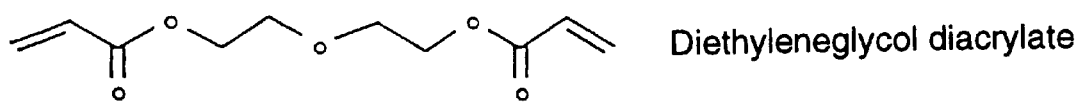 Diethyleneglycol diacrylate
 Allylmethacrylate
 Triallylamine
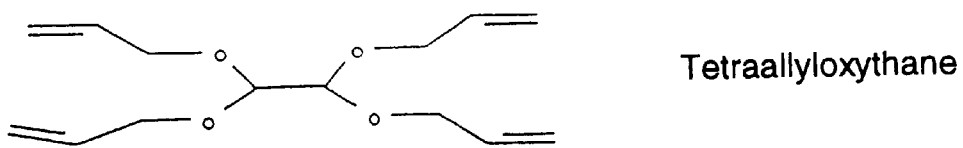 Tetraallyloxythane
FIG. 12

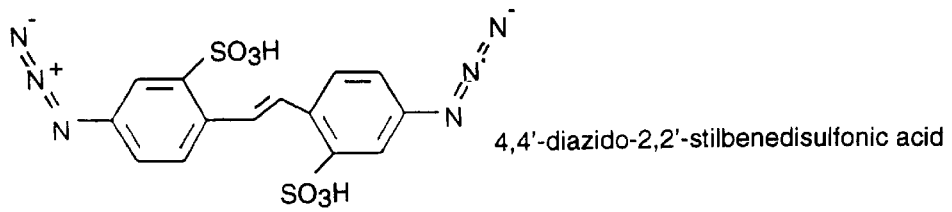
4,4'-diazido-2,2'-stilbenedisulfonic acid
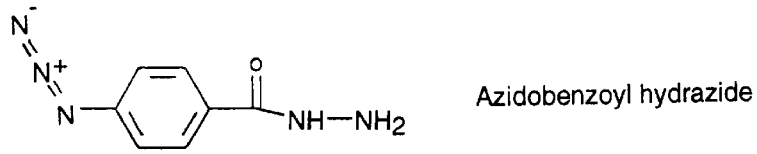
Azidobenzoyl hydrazide
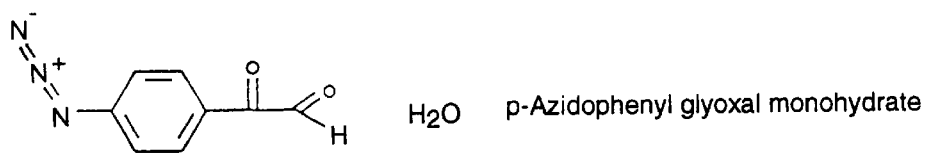
p-Azidophenyl glyoxal monohydrate
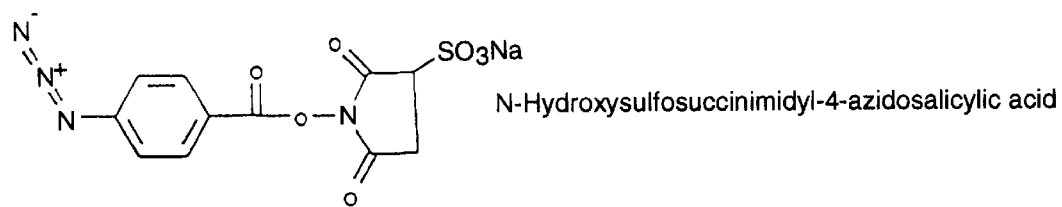
N-Hydroxysulfosuccinimidyl-4-azidosalicylic acid
FIG. 15

INTEGRATED CIRCUIT TESTING APPARATUS

We Relate back to application Ser. Nos. 60/109,063, filed Nov. 19, 1998, and 60/115,269, filed Jan. 8, 1999, which priority is hereby claimed, as per attached receipts, incorporated herein by reference.

THE FIELD OF THE INVENTION

This invention relates to an integrated circuit testing apparatus and more specifically to a probe unit and a method of making the probe unit for the testing apparatus.

BACKGROUND

Integrated circuits are fabricated on a semiconductor wafer using a variety of chemical and physical processes. Several hundred integrated circuits may be fabricated on a single wafer and sectioned into individual pieces after the integrated circuits have been tested for functional integrity.

Integrated circuits are tested by contacting the conductive pads on the wafer with a probe unit, which is connected to a probe card. The probe card contains the circuitry necessary to perform electrical diagnosis and characterization of the integrated circuits. A traditional probe unit includes pogo pins or needles suspended from the body of the probe unit for contacting the electrical pads of the integrated circuits of the wafer. The pins or needles are conductive, and thus when in proper contact with the pads provide electrical communication between an integrated circuit being tested and the probe card. Providing adequate contact between the pins or the needles and the conductive pads, however, is not trivial because the conductive pads on the substrate can have varying height due to manufacturing tolerances. Thus when the probe unit is placed in contact with the wafer, one pin or needle can be advanced too far and scratch or damage the pad of the device with which it makes contact, while another pin or needle does not even contact it's respective pad. Although the pogo pins or needles are suspended from the body of the probe unit using a spring mechanism to compensate for some height differences in the contact pads, this contact problem persists.

An alternative to a traditional probe unit is a flexible probe unit which compensates for the differences in height between the contact pads of a wafer. U.S. Pat. No. 4,906,920 ('920) describes an example of a flexible probe unit. The '920 probe unit includes a flexible membrane supporting contact bumps. The flexible membrane pivots horizontally to adjust for non-planarity of the contact pads on a wafer. The contact bumps themselves, however, are not flexible. Therefore, compliance of the probe unit is limited.

An objective of the present invention is to provide a probe unit for an integrated circuit testing apparatus which includes flexible contacts that individually compensate for any differences in height or shape between the pads.

SUMMARY OF THE INVENTION

The invention relates to an integrated circuit testing apparatus. The apparatus includes a probe card, and a probe unit. The probe unit includes a plurality of conductive elastic bumps and a plurality of conductors positioned to conduct signals from the bumps to the probe card. In one embodiment, the apparatus further comprises a substrate disposed between the probe card and the probe unit and a flexible member disposed adjacent the substrate. The substrate can comprise a ceramic or a semiconductor substrate. The flexible member can be an elastomer.

In one embodiment, the conductive elastic bumps comprise a conductive elastic polymer. The conductive elastic polymer can be a conductive polymer doped with a plasticizer. The conductive polymer can be selected from a group consisting of polyaniline, polypyrrole, polythiophene, polyphenylene, polyacetylene and their derivatives. The conductive polymer can comprise polyaniline, and the plasticizer can comprise an acid. The acid can be one of dodecylbenzenesulfonic acid and camphorsulfonic acid. In another embodiment, the conductive elastic polymer comprises a surface modified conductive polymer. In one detailed embodiment, the conductive elastic polymer comprises polyaniline graft copolymerized with a vinyl monomer. The vinyl monomer can be selected from a group consisting of acrylic acid, sodium salt of styrenesulfonic acid, acrylamide, and 4-vinylpyridine. In another embodiment, the conductive elastic polymer comprises a conductive polymer cross-linked with a resin-forming adhesive copolymer. The conductive elastic polymer can comprise polyaniline formaldehyde resin. For example, the conductive elastic bumps can comprise a polyaniline cross-linked with a copolymer comprising acrylic acid and acrylamide. In still another embodiment, the conductive elastic polymer comprises an electrically conductive polymer copolymerized with a cross-linked dielectric polymeric backbone.

In one embodiment, the conductive elastic polymer is cross-linked. In another embodiment, the conductive elastic polymer is an interpenetrating polymer. The plurality of conductive elastic bumps can be hemispherical in shape. The conductive elastic bumps are capable of being compressed to less than about 70% of the original thickness. The conductive elastic bumps can comprise a conductive polymer layer on an outer surface.

In one embodiment, the probe card is in electrical communication with the plurality of conductive elastic bumps through a via which extends through a substrate and a PCB supporting the bumps. Where the probe unit includes a flexible member disposed adjacent the substrate, a flexible conductor is disposed within the flexible member for communication with the via. The flexible conductor can be a gold fuzz ball.

In another embodiment, the probe unit further comprises a plurality of ground pads disposed between a plurality of striplines and the bumps, where each stripline is connected to a respective bump. The plurality of conductive elastic bumps are individually disposed on a respective microstripline. In one detailed embodiment, one of the plurality of striplines forms a laser trimmable flange of a waveguide. In another detailed embodiment, the probe unit further comprises active or passive components embedded within the probe unit. The passive component can be a capacitor, and an active component can be a multiplexer.

In still another embodiment, the probe unit comprises a plurality of independently mobile sections, each section comprising at least one contact bump. A flexible member can support the plurality of sections. An elastomer can be disposed within a space between adjacent sections.

In yet another embodiment, the probe unit further comprises a voltage equilibrating site surrounding a contact bump. The voltage equilibrating site includes a first dielectric ring surrounding the contact bump, a metal ring surrounding the first dielectric ring, and a second dielectric ring surrounding the metal ring. The voltage equilibrating sites may be used to clean the bumps. In another embodiment, the probe unit further comprises a temperature sensor.

The invention also relates to a method of manufacturing a probe for an integrated circuit testing apparatus. The method includes the steps of: a) providing a printed circuit board (PCB); b) forming an conductive elastic material; and c) disposing the conductive elastic material on a surface of the PCB to form a plurality of bumps. In one embodiment, step b) comprises forming an conductive elastic polymer. An conductive elastic polymer in one embodiment is formed by doping a conductive polymer with a plasticizer. Alternatively, an conductive elastic polymer can be formed by modifying the surface of a conductive polymer. For example, a surface of a conductive polymer can be modified by graft copolymerizing with a vinyl monomer. Examples of suitable vinyl monomers include acrylic acid, sodium salt of 4 styrenesulfonic acid, acrylamide, and 4-vinylpyridine. The conductive elastic polymer can be a cross-linked polymer. One example of a suitable conductive elastic polymer is a polyaniline-dodecylbenzenesulfonic acid gel. Another example of a suitable conductive elastic polymer is a copolymer resin formed by preparing aniline-formaldehye condensate and polymerizing aniline using the condensate.

In one embodiment, step c) comprises printing the gel on the surface of the PCB. In another embodiment, step c) comprises dispersing a copolymer resin in an organic solvent on the surface of the PCB. The dispersion can comprise a conductive polymer in an organic solvent containing a photocross-linkable agent. In still another embodiment, step b) comprises forming a precursor of a conductive elastic material, and step c) comprises disposing the precursor on a surface of the PCB, patterning the precursor, and curing the precursor to form a plurality bumps. Curing the precursor cross-links the conductive elastic polymer. Curing the precursor comprises exposing the precursor to UV radiation. The precursor can be partially cured before being patterning, and subsequently fully cured to form a plurality of bumps. In one example, the precursor comprises polyaniline and a photocross-linkable adhesive copolymer.

The formed bumps can be further treated in a variety ways. For example, a conductive polymer layer can be placed on a surface of the conductive elastic polymer. The bumps can also undergo a planarizing step by contacting the bumps with a planar surface, while the bumps are fully cured. In one example, a plurality of elongated bumps are first formed on a PCB, and the bumps become spherical during the planarization step. The bumps can also be polished using silver or diamond. The bumps can be passivated with a chemical agent such as sulfur.

In another embodiment, the method further includes the step of forming a variety of devices inside the probe. For example, a laser trimmable flange of a waveguide can be formed within the probe such that each waveguide is connected to a respective bump. These waveguides can be formed by laser ablating the flange to tune an impedance of the wave guide. The waveguide can handle a frequency up to about 20 GHz. An active component such as a multiplexer or a passive component such as a capacitor can be formed within the probe.

In still another embodiment, the method further comprises the step of disposing a substrate on a surface of the PCB away from the surface having the bumps. The substrate can be a ceramic or a semiconductor substrate.

The invention also relates to a method of testing an integrated circuit. The method includes the steps of: a) providing a substrate having the integrated circuit; b) contacting a plurality of contact pads on the substrate with a plurality of conductive elastic bumps of a probe unit which is in communication with a probe card; and c) measuring an electrical property of the integrated circuit. In one embodiment, the method further includes the step of applying a pressure in the range from 0.1 grams to 0.5 grams per contact bump to maintain less than 300 ohms of contact resistance, in order to contact the plurality of contact pads with the plurality of bumps. In another embodiment, a flexible member for providing additional compliance of the probe unit is disposed between the probe unit and the probe card.

In still another embodiment, the method further comprises the step of making a plurality of independently mobile sections. Each section comprises at least one bump disposed on a PCB, and a flexible member supports the plurality of sections. An elastomer can be placed in the spaces between adjacent sections.

In still another embodiment, the method further includes the step of forming a voltage equilibrating site around each bump. A voltage equilibrating site, for example, has a first dielectric ring around a bump, a metal ring around the first dielectric ring, and a second dielectric ring around the metal ring. This probe unit can sense voltage accumulation on the substrate, and equalize the voltage between the probe unit and the substrate.

In yet another embodiment, the method further includes the step of cleaning the bumps. The steps of cleaning the bumps include applying various electrostatic forces around the bumps to attract particles away from the bumps.

BRIEF DESCRIPTION OF THE DRAWINGS

These and other advantages of the invention may be more clearly understood with reference to the specification and the drawings, in which:

FIGS. 6a–6f illustrates various monomers and dopants for forming conductive polymers and their conductivity.

FIG. 7 illustrates a segment of the polymer polyaniline.

FIG. 8 illustrates sulfonic acids which are used to dope and plasticize emeraldine salts.

FIGS. 9a–9d illustrate a series of steps in one embodiment of a method of manufacturing conductive elastic bumps for an integrated circuit testing apparatus.

FIG. 12 illustrates a number of vinyl monomers and cross linkers useful in synthesis of adhesive, elastic networks which graft onto conductive polymers.

FIG. 15 illustrates a number of bifunctional photoactive cross-linkers.

FIG. 22b is a plan view of the apparatus of FIG. 22a.

DESCRIPTION OF THE PREFERRED EMBODIMENT

Figure 1:
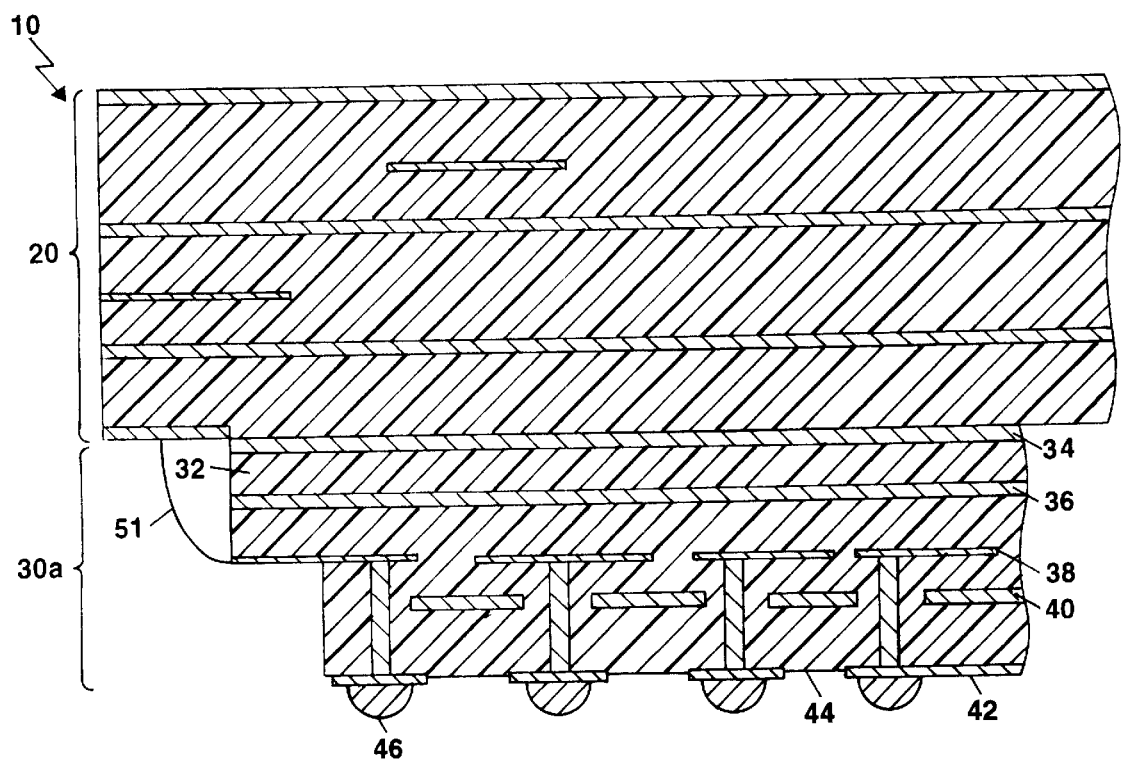
FIG. 1 is a cross-sectional view of an embodiment of the probe portion of an integrated circuit testing apparatus.

Referring to FIG. 1, an integrated circuit testing apparatus 10 includes a probe card 20 and a probe unit 30a. The probe card 20 may include the circuitry necessary for electrically characterizing integrated circuits. The probe card 20 is disposed adjacent the probe unit 30a and is electrically connected to the probe unit 30a. In FIG. 1, for example, the probe card 20 is connected to the probe unit using a tab connection 51 or wire bond. Alternatively, the probe card 20 and the probe unit 30a may be electrically connected using vias, or through other appropriate means known to those skilled in the art.

The probe unit 30a includes a printed circuit board (PCB) 32 having a power plane 34, a ground plane 36, striplines 38, and ground pads 40 embedded in the PCB 32. The PCB 32 further includes microstrips 42 disposed on one surface 44 of the PCB 32, and contact bumps 46, each bump individually disposed on a microstrip 42. Vias 48 electrically connect the microstrips 42 with the striplines 38. The contact bumps 46 are formed of an conductive elastic material. An elastic material is a material which can be stretched or compressed under application of low stress, and which returns with force to its original state upon release of the stress. The elastic material suitable for use as contact bumps has a low modulus of elasticity. For example, the elastic material can have a modulus of elasticity of less than about 0.0104.

Figure 2:
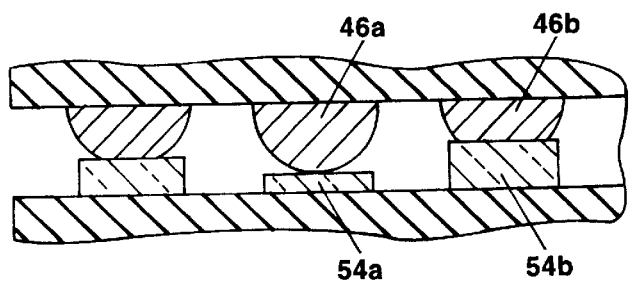
FIG. 2 is a cross-sectional view of a portion of the probe unit of the integrated circuit testing apparatus of FIG. 1 in contact with a wafer.

When the probe unit 30a contacts a wafer being tested, each contact bump 46 deforms due to its elastic property to provide good contact with a corresponding contact pad without damaging the contact pad. As shown in FIG. 2, for example, a first contact bump 46(a) disposed over a shorter contact pad 54(a) may deform very little or not at all, while a second contact bump 46(b) disposed over a taller contact page 54(b) may deform significantly. However, both contact bumps 46(a), 46(b) form good connection with their corresponding contact pads 54a, 54b. Thus, minor discrepancies in height between the various contact pads would not affect the probe unit's ability to form proper contact with the contact pads 54a, 54b of the wafer.

Figure 3:
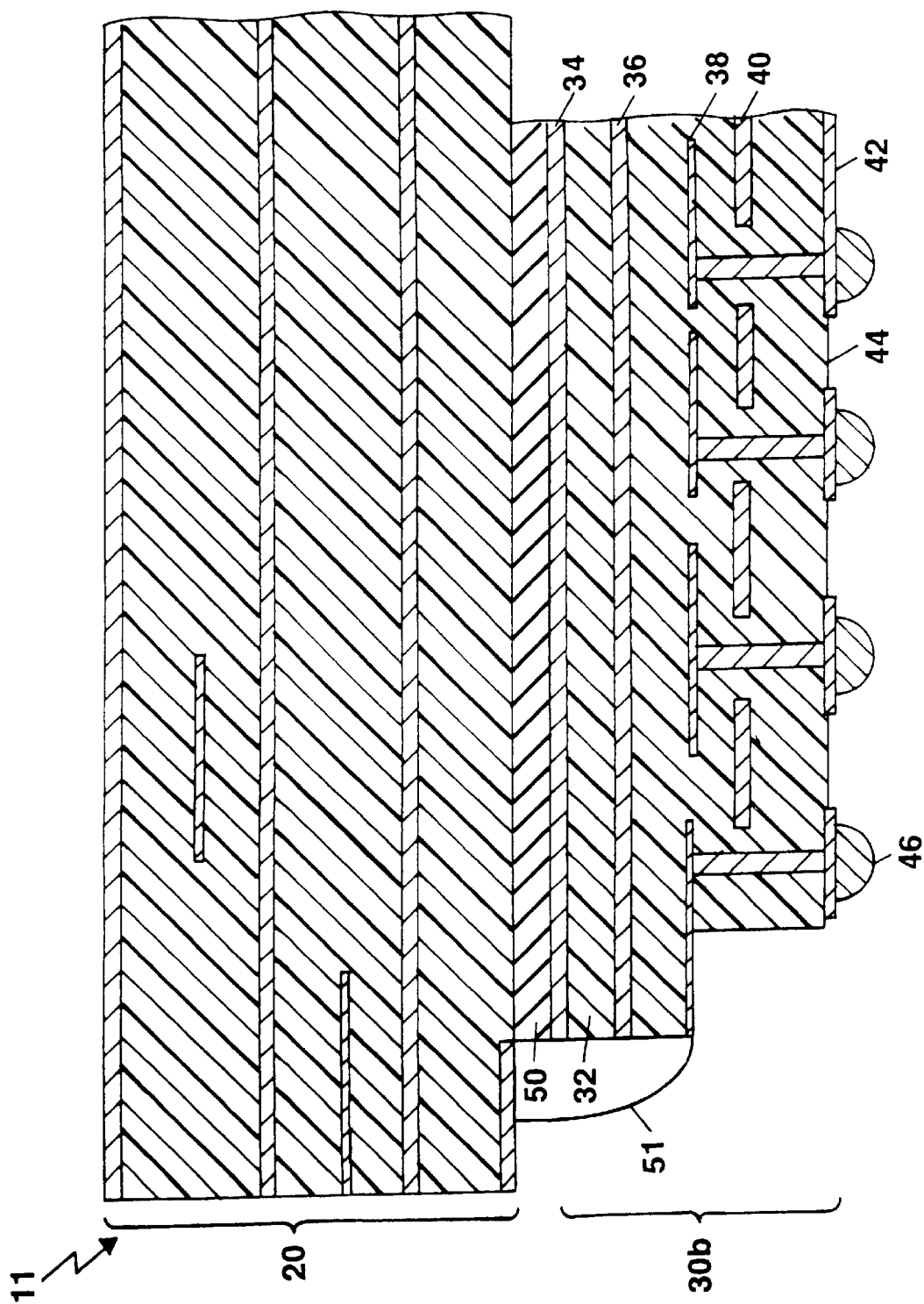
FIG. 3 is a cross-sectional view of another embodiment of the probe portion of an integrated circuit testing apparatus.

Referring to FIG. 3, another embodiment of the integrated circuit testing apparatus 11 includes a probe card 20 and a probe unit 30b. The probe unit 30b includes contact bumps 46 disposed on one surface 44 of the probe unit 30b. The contact bumps 46 are conductive and elastic. The probe unit 30b further includes a flexible member 50 disposed on the second surface 45 of the probe unit 30b. The flexible member 50, for example, can comprise an elastomer. The flexible member 50 provides additional compliance for the probe unit 30b. Other features of the probe unit 30b is similar to the probe unit 30a of FIG. 1.

Figure 4:
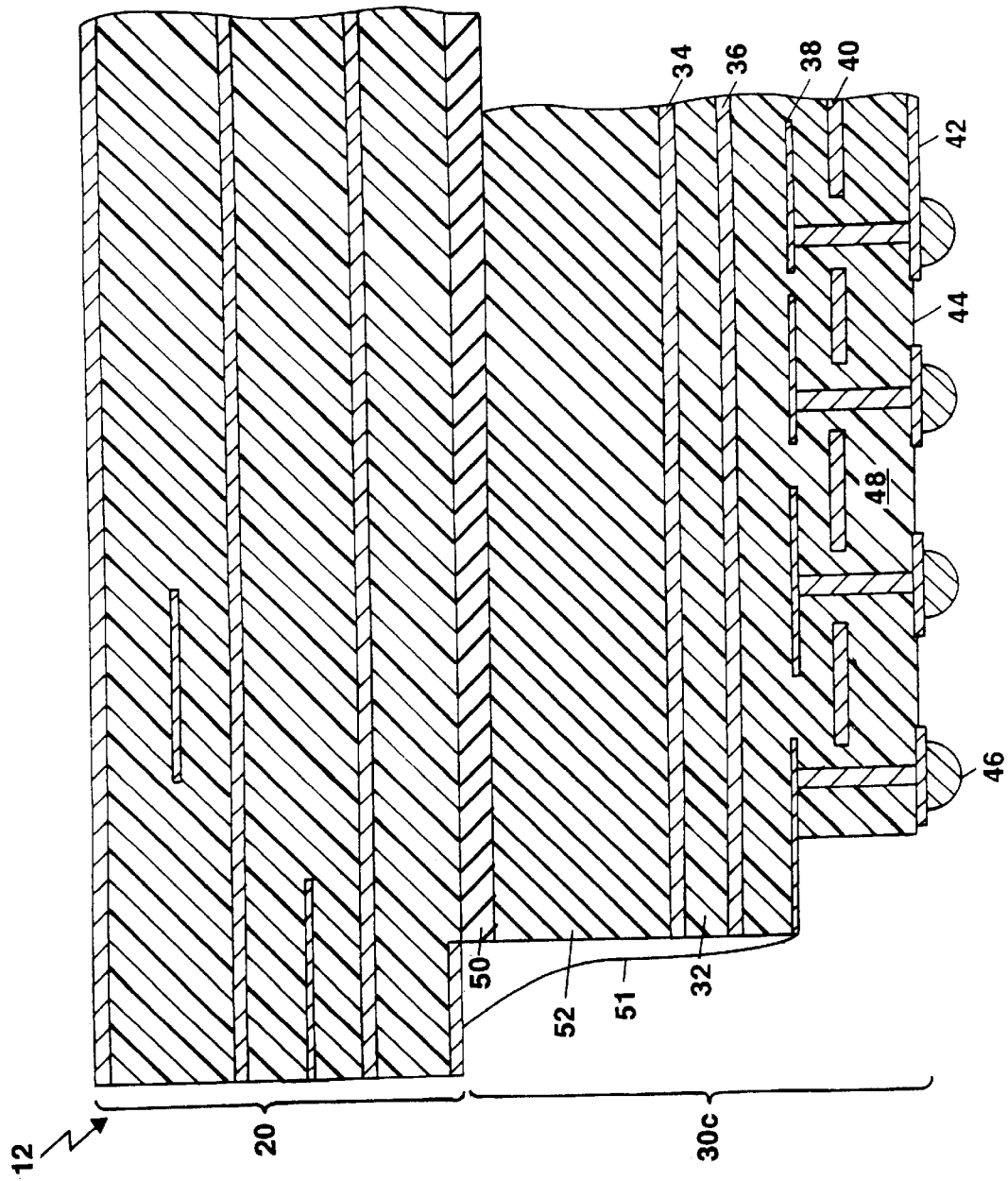
FIG. 4 is a cross-sectional view of another embodiment of the probe portion of an integrated circuit testing apparatus.

Referring to FIG. 4, still yet another embodiment of the integrated circuit testing apparatus 12 includes a probe card 20 and a probe unit 30c. The probe unit 30c includes a flexible member 50, a substrate 52 disposed adjacent the flexible member 50, a PCB 32 comprising power and ground planes 34, 36 disposed adjacent the substrate 52, microstrips 42 disposed on the PCB 32, and contact bumps 46 disposed on the microstrips 42. The substrate 52 has a substantially flat surface. The flat surface of the substrate 52 allows the probe unit 30c to have a planar lower surface. The substrate 52 can be any planar non-compressive substrate, for example, a ceramic or semiconductor substrate.

Figure 5:
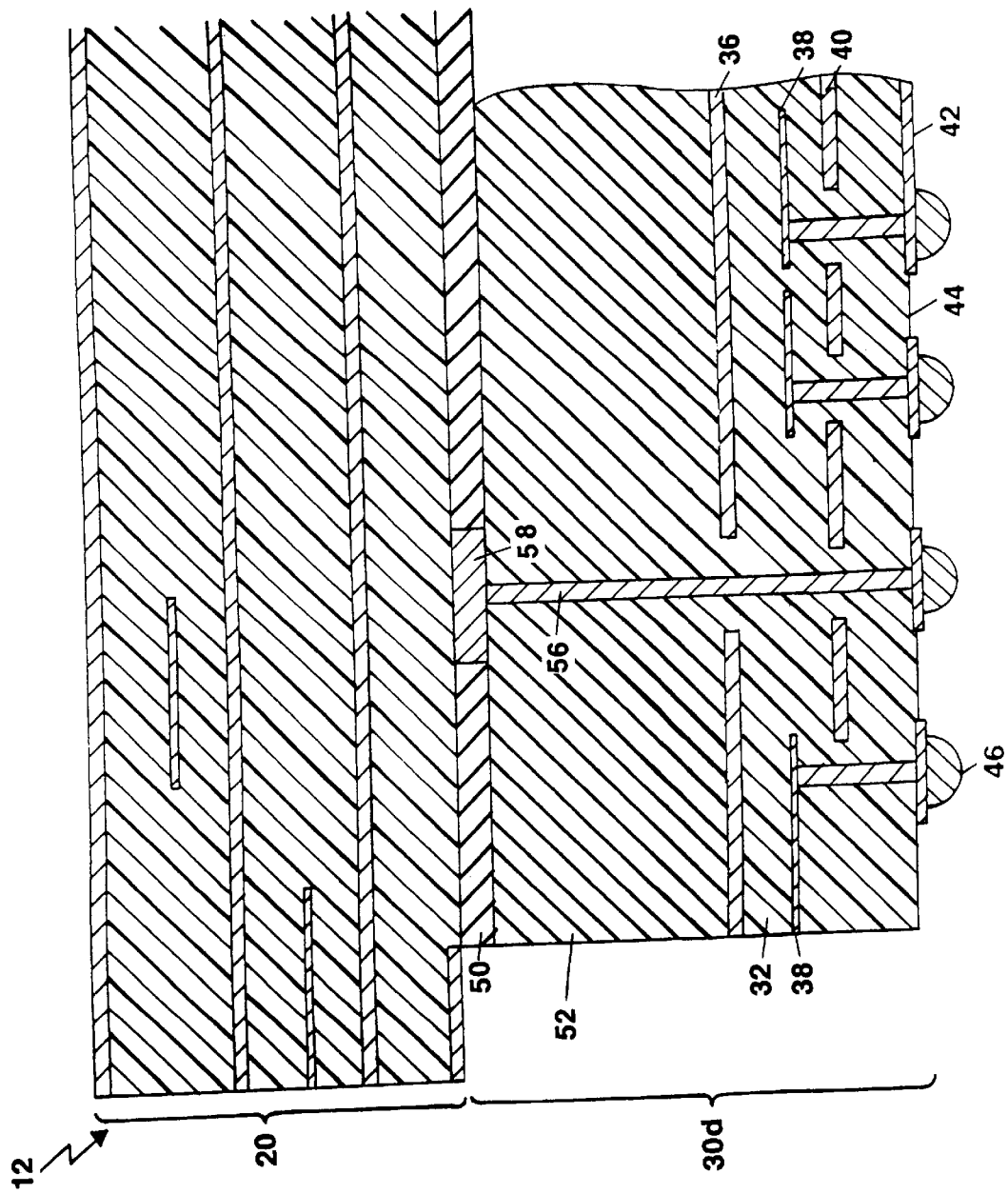
FIG. 5 is a cross-sectional view of another embodiment of the probe portion of an integrated circuit testing apparatus.

Referring to FIG. 5, yet another embodiment of the integrated circuit testing apparatus 13 includes a probe card 20 and a probe unit 30d. The probe unit 30d includes a flexible member 50, a substrate 52, and contact bumps 46. In this embodiment, the contact bumps 46 are electrically connected to the probe card 20 through a via 56 which extends through the substrate 52 and the PCB 32. A method for aligning the probe unit 30d with the probe card 20 is well known to those skilled in the art. Briefly, the probe card 20 is placed under a calibrated image scanner to determine initial registration of a top layer of the artwork of the PCB. A mechanical arm picks up the probe head and places the probe head under the image scanner to determine registration of the bumps. The necessary x travel, y travel and theta rotation is then computed and the mechanical arm places the probe head on the probe card in correct alignment. This technology is used in surface mount manufacturing. The flexible member 50 can have an adhesive on a top surface and a bottom surface to prevent sliding of the probe head relative to the probe card.

The flexible member 50 includes a flexible conductor 58 which provides electrical connection between the via 56 and the circuitry in the probe card 20. The flexible conductor 58 prevents the flexible member 50 from losing any flexibility while providing an electrical connection. The flexible connector 58, for example, can be a conducting fizz ball, such as a gold fuzz ball. A conducting fuzz ball is composed of a randomly wadded conducting wire.

In one embodiment, the integrated circuit testing apparatus of the present invention has a probe unit which includes a waveguide. For example, one of the plurality of striplines 38 can be formed as a laser trimmable flange of a waveguide, which is connected to a respective bump. The characteristic impedance of the waveguide can be tuned via laser ablatement of a tuning stub, which compensates and corrects for the ±10% manufacturing line tolerances. Striplines and microstrips form layered waveguides. Such waveguides can handle frequencies up to 20 GHz. Properties of waveguides and methods of their manufacture are well known to those skilled in the art.

In another embodiment, the integrated circuit testing apparatus has a probe unit which includes one of an active or a passive component embedded within the probe unit between the substrate and the interconnect wiring of the probe unit. Alternatively, the component can be placed on a backside of the probe unit via conventional solder attachment. In this case, the flexible member can be designed to distribute the stress variation resulting from the surface variations. The component can be a passive component such as a capacitor or an active component such as a multiplexer. Embedding the active and/or passive components in the probe unit allows the probe unit to process locally electrical signals of the probe unit. This eliminates the probe unit inductance, which in turn allows higher operating frequencies for the probe unit and better power supply decoupling.

The contact bumps 46 used in the integrated circuit testing apparatus of the present invention can comprise a variety of materials. In one embodiment, the bumps 46 comprise an elastic polymer mixed with gold, silver, or another conductive material. An example of an electrically conductive material is a thermoset epoxy polyimide filled with conductive particles. The use of filled composite materials, however, limits the elasticity of the bumps and tends to develop fatigue cracking, thereby limiting the number of compression-recovery cycles that the contact bumps 46 can undergo. In a preferred embodiment, the contact bumps 46 comprise conductive, elastic polymers, which need not be filled with metal particles. An appropriate conductive, elastic polymer possess significant inherent conductivity, can repeatedly be subjected to compression recovery cycles, and can be selectively deposited on any surface to form the bumps.

The conductive elastic polymer can be made using a variety of methods. In one embodiment, a conductive polymer is made elastic by doping the conductive polymer with a plasticizer. Electrically conductive polymers typically are inherently rigid or semirigid and mostly intractable because they do not melt before decomposition. However, doping a conductive polymer with an appropriate plasticizer produces an elastic gel. In another embodiment, a conductive polymer is made elastic through copolymerization and/or complexation of the conductive polymer with a permanently cross-linked dielectric polymeric backbone. Examples of appropriate monomers which form conductive polymers include, but are not limited to those provided in FIG. 6.

The following examples provide various detailed embodiments of conductive elastic polymers suitable for forming contact bumps and methods of manufacturing such polymers.

EXAMPLE 1

Electrically conductive emeraldine salt of polyaniline as shown in FIG. 7 is a highly conductive polymer. Emeraldine salts are soluble in strong acids, such as for example $H_{2SO4}$, HF, HBr, and HCl. Dodecylbenzenesulfonic acid (DBSA) or camphorsulfonic acid shown in FIG. 8 both dope and plasticize emeraldine salts. In the present example, an elastic gel is formed using polyaniline and DBSA.

Polyaniline, in its emeraldine base form, is prepared chemically by direct oxidation of aniline. Preparation of polyaniline by direct oxidation is well known to those skilled in the art. The viscosity of polyaniline in this example is about 0.9 dL/g measured by an Ubbelohde viscometer for a 0.1 wt % solution in 97 wt % sulfuric acid. The weight-average molecular weight of polyaniline is about 120 000 as determined by Gel Permeation Chromatography (GPC). The Polyaniline is dried at about 60° C. in vacuum for two days and subsequently stored in a desiccator. Samples with weight ratios of 20/80 and 15/85 of the emeraldine base form of polyaniline and DBSA are prepared as follows. Polyaniline and DBSA at their total weight fraction of 2.5 wt % are mixed with 97.5 wt % formic acid and stirred at 60–80° C. for about 24 hours. The formic acid is subsequently evaporated on a hot plate at about 80° C., and the mixtures are dried in vacuum. The samples are stored in a desiccator.

Cyclic compression and relaxation experiments were performed on the prepared polymer samples using a Rheolyst series AR1000 Rheometer (TA Instruments) apparatus to study the elastic behavior of the polymeric samples. Cylindrical polymer samples were cut with a diameter of about 4 mm and a height of about 2 mm. A polymer sample was first compressed to 70% of the original thickness. The compression was then removed, and the relaxation of the polymer sample thickness was measured as a function of time. The cycle was repeated.

The conductivity of the samples cut into a cube having a dimension of $3 \times 1 \times 1$ mm$^3$ was measured at ambient temperature using the conventional four-probe technique with pressed contacts. Constant current values were imposed for about 10 seconds for each current, and the corresponding voltage was averaged for each current. The resistance and thus the conductivity were determined from the linear current-voltage behavior. The measurements were taken under atmospheric conditions.

The Polyaniline-DBSA samples showed elastic behavior. The sample thickness recovered completely following a compression to 80% of the original thickness within 1–3 minutes. The observed elastic behavior in repeated cycles indicates the formation of physical networks, analogous to those in cross-linked rubber. The polyaniline—DBSA gel melted above 200° C. Electronic conductivities of 20% and 15% polyaniline samples measured from current-voltage characteristics at ambient temperature were 3 S/cm and 0.8 S/cm, respectively.

The observed rubber-like polyaniline-DBSA gels were stable at room temperature for at least 0.5 year and capable of repeatedly melting at temperatures above 250° C. without appreciable damage. The gels were capable of being deposited onto metal supports in their melted state in a form of spherical droplets of a desired size. Upon cooling at ambient temperature, the droplets formed rounded bumps. The presence of the plasticizer (DBSA) made the gels adhere to various supports.

Referring to FIG. 9, the polyaniline-DBSA melts and/or gel 60 can be screened or stencil printed onto any substrate 62. The formed bumps 68 can be protected from mechanical damage and/or harmful vapors by a conductive layer 66 formed through a conventional electropolymerization of aniline 64 on the gel surface. Electrochemically synthesized polyaniline possesses very high chemical stability. Electrochemical polymerization of polyaniline and other conductive polymers is known to those skilled in the art.

EXAMPLE 2

Synthesized polyaniline, while stable in different environments, suffers from low molecular weight, which typically results in low mechanical strength and poor elasticity. In addition to low mechanical strength, adhesion of polyaniline to solid substrates, such as glass, metal, or semiconductor is limited.

In the present example, elastic rubber-like network of a large molecular weight is formed by condensation of aniline and formaldehyde, following chemical polymerization of aniline and deposition of polyaniline-formaldehyde condensates in the form of adhesive, conductive droplets. The molecular weight of the network is limited only by the volume of the material used.

The method described in this Example utilizes aniline-formaldehyde condensates to cross-link polyaniline. The copolymer is synthesized by oxidizing aniline-formaldehyde condensates-aniline mixtures at room temperature. A wide range of molecular weights can be obtained by simply adjusting the ratio of aniline-formaldehyde condensates to aniline prior to polymerization. The conductivity of the copolymer is a function of the ratio of aniline-formaldehyde condensates to aniline, and therefore can be varied systematically.

Figure 10:
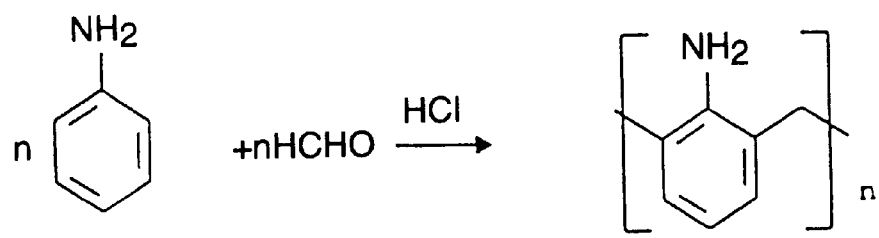
FIG. 10 illustrates the reaction sequence in the formation of aniline-formaldehyde condensate polymer.

Aniline-formaldehyde condensate (AFC) is synthesized by reacting formaldehyde with aniline as shown in FIG. 10. In a 50 mL reactor, 2.5 mL of 37% formaldehyde is added to a mixture of 4.8 g of aniline and 1.5 mL of 37% HCl. Condensation is carried at 100° C. for 2 hours. The temperature is then decreased to 60° C. and the mixture is neutralized with 2 mL of 30% NaOH, resulting in an liquid resin. The resin is then washed with warm water three times and separated from the aqueous layer. The resin is kept at 80° C. under vacuum to remove any unreacted aniline and/or formaldehyde.

Figure 11:
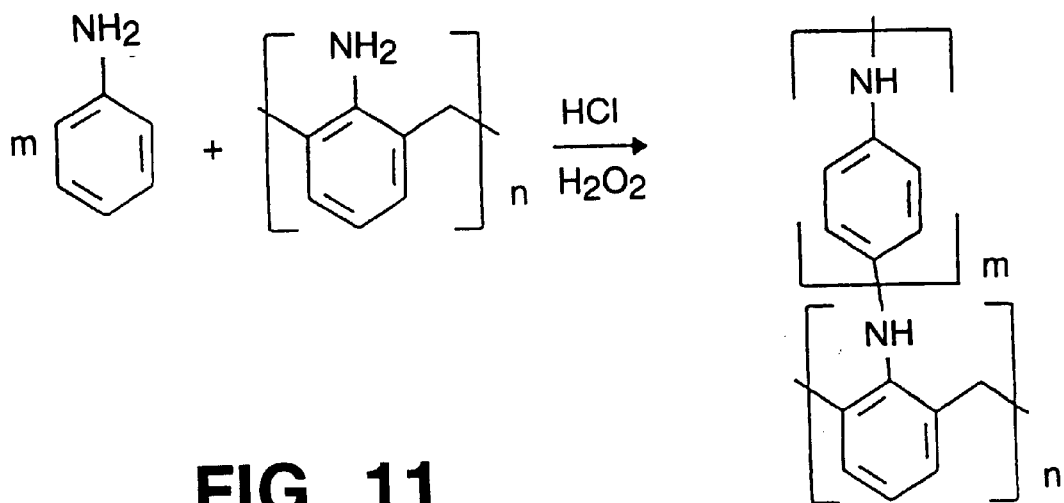
FIG. 11 illustrates copolymerization reaction sequence in the formation of an aniline and aniline-formaldehyde condensate.

The chemical polymerization of aniline is then performed as provided in FIG. 11. In a 100 mL reactor, AFC and aniline monomer are dissolved in 75 mL of 1 M HCl aqueous. A trace amount of $FeSO_4$ is added to the solution as a catalyst. Then 2.25 mL of 30% $H_2O_2$ is added dropwise to the solution with vigorous stirring. After polymerization for 6 hours at 25° C., a dark precipitate is obtained. The powder is washed with 1 M HCl until the washing solution became clear.

Molecular weights of the polymers were determined using gel permeation chromatograph (GPC) with a mobile phase of 50% N-methylpyrrolidone/50% tetrahydrofuran (v/v) and polystyrene as a standard. Pellets of the polymers were made by pressing at 12,000 psi. The conductivities of acid (1 M HCl) doped polymer pressed pellets were determined using two platinum (Pt) contacts and a multimeter in a well-defined geometry (cross sectional area of the polymer was 0.05×1 cm and the length was 2 cm). Cyclic voltammetry was performed on an electrochemical analyzer.

The weight-average of a typical polyaniline-AFC fraction was determined to be above $1.2 \times 10^6$. The copolymers were generally soluble and/or dispersible in organic solvents, such as dimethylsulfoxide (DMSO) and N-methylpyrrolidone. Dispersion of 20% of the copolymer resin in DMSO was deposited in the form of 0.2 mm droplets on an aluminum plate followed by drying under vacuum for 24 hours. The droplets showed strong adhesion, as indicated by inability to remove bumps of the polymer (~25$\mu$ in thickness) with adhesive tape in a standard peel test. The polyaniline-AFC resins showed elastic behavior typical for ideal rubbers. Conductivity of dried films was about 10 S/cm.

EXAMPLE 3

In the present example, electroactive and elastic copolymers are obtained via surface modification of electroconductive polymers, such as polyaniline films by graft copolymerization with acrylamide, acrylic acid, sodium salt of 4-styrenesulfonic acid, or other vinyl monomers, and/or cross-linkers. The resulting conductive films exhibit strong adhesion to glass, aluminum, steel, and other solid supports. The films can be deposited onto chips by printing techniques known to those skilled in the art.

The monomers used for graft copolymerization, such as acrylic acid (AAc), sodium salt of 4-styrenesulfonic acid (NaSS), acrylamide (AAm), and 4-vinylpyridine (VP) along with di-, tri-tetravinyl cross-linkers are shown in FIG. 12, and are incorporated herein as examples.

Emeraldine salt of polyaniline is prepared by the oxidative polymerization of aniline by ammonium persulfate in 1 M HCl according to the method known in the art. Emeraldine salt of polyaniline is converted to neutral emeraldine base (EB) by treatment with excess 0.5 M NaOH and dried by pumping under reduced pressure. Free standing and lightly cross-linked EB film is prepared by heating the concentrated N-methylpyrrolidinone gel solution (containing 8% EB by weight) at 150° C. for 6 hours, followed by exhaustive pumping. The EB film so prepared has a tensile yield strength of about 120 $N/cm^2$. Graft copolymerization is carried out as follows. EB film strips of about 2.0 cm×4.0 cm are used in grafting. In the case of graft copolymerization with AAc, each EB film is immersed in an aqueous AAc solution of a predetermined concentration in a glass ampoule. The reaction mixture is degassed with $N_2$ and subsequently sealed. The reaction mixture is then kept in an 80° C. water bath for about 1 hour.

In separate experiments, divinyl liquid cross-linkers were used along with the AAc at a 1:100 AAc:cross-linker level. After each grafting experiment, the EB film was removed from the viscous homopolymer solution and washed with a jet of double-distilled water. It was then immersed in a room-temperature water bath with continuous stirring for at least 48 hours to remove the residual homopolymer. Similar procedures were also used for the graft copolymerization with NaSS, AAm, and DMAPS monomers. Adhesive-free adhesion was achieved by lapping the graft copolymerized strips onto aluminum plates at room temperature, in the presence of 5 $\mu$L water, and 70% relative humidity. The area of the moist graft copolymerized films was kept at 5 mm ×5 mm. After two hours of adhesion drying time, the adhesion strength was determined by measuring the lap shear adhesion force using a microprocessor controlled Rheometrics Miniature Materials Tester. All measurements were carried out at a crosshead speed of 10 mm/min. Elasticity of the films in cyclic compression and relaxation experiments was measured using a Rheolyst series AR1000 Rheometer (TA Instruments). Cylindrical samples were cut with a diameter of about 2 mm and a height of about 1 mm. The sample was first compressed to 70% of the original thickness. The compression was then removed, and the relaxation of the sample thickness was measured as a function of time. The cycle was repeated.

Lap shear adhesion strength between graft-copolymerized polyaniline films and aluminum support was measured to be in excess of 10 $N/cm^2$, whereas the shear adhesion strength of non-modified polyaniline was below 1 $N/cm^2$. The film had 10% graft copolymer content, and was cross-linked by ethyleneglycol dimethacrylate. The adhesion time was about two hours. In the cyclic compression experiments, complete recovery after 70% compression was observed within 1–2 seconds in at least 100 cycles. Conductivity of the films was at least about 1 S/cm. The conductive elastic polymers provided in Examples 1–3 can be made into small contact bumps of a probe unit by dosing small amount of ingredients necessary to form the polymers.

EXAMPLE 4

In the present example, contact bumps are formed by a photolithographic process using conductive polymers and resin-forming adhesive copolymers. An advantage of such material is that it combines the elasticity of the resin forming adhesive which is cross-linked with the high ohmic conductivity behavior of the conductive polymer, and thus offer a novel class of processable materials. In addition, such materials can be photolithographically deposited onto chips. The application is similar to creation of photoresists. A photoresist contains three main components: a photoactive compound (PAC), a resin, and a carrier solvent. The photoactive compound may be blended in with the resin or bonded directly to the resin.

Figure 13:
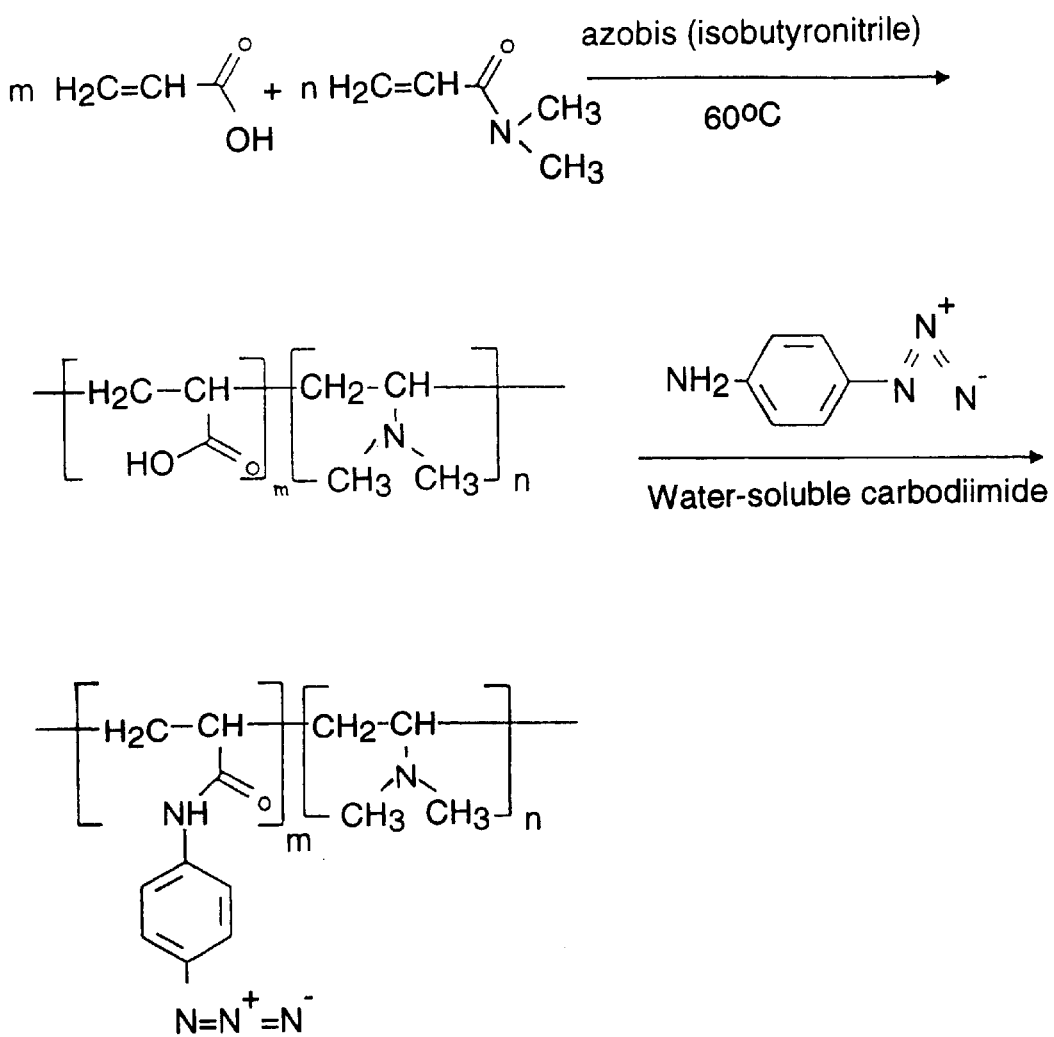
FIG. 13 illustrates the reaction sequence in the formation of an embodiment of a photoactive, adhesive copolymer from a copolymer of acrylic acid and acrylamide modified with azidophenyl.

Photolithographic synthesis of conductive materials was carried out as follows. Polyaniline, in its emeraldine base form, was prepared chemically by direct oxidation of aniline. The viscosity of polyaniline was 0.9 dL/g measured by an Ubbelohde viscometer for a 0.1 wt % solution in 97 wt % sulfuric acid. The weight-average molecular weight of polyaniline was 120,000 as determined by GPC. Polyaniline was dried at 60° C. in vacuum for two days and subsequently stored in a desiccator. A photocross-linkable adhesive copolymer was synthesized from a copolymer of acrylic acid and acrylamide modified with azidophenyl as shown in FIG. 13.

The copolymer was synthesized through copolymerization of N,N-dimethylacrylamide with acrylic acid at a molar ratio of 95/5 in isobutyl alcohol (30 mL, total monomer concentration 2.0 M) containing 2,2'-azobis (isobutyronitrile) (5 mg). The mixture was deoxygenated, sealed, and heated at 60° C. for 24 hours. The resulting mixture was diluted with methanol and the copolymer was precipitated by diethyl ether. The copolymer was subsequently activated by water-soluble carbodiimide and modified by azidophenyl as follows. The copolymer (100 mg), 4-azidoaniline (200 mg), and 1-ethyl-3-[3-(dimethylamino) propyl]carbodiimide hydrochloride (water-soluble carbodiimide, 150 mg) were dissolved in 0.1 M 2-morpholinoethanesulfonic acid-buffered solution (20 mL, pH 4.5), and the mixture was stirred at 4° C. for 24 hours. The solution was evaporated, redissolved in water and purified with dialysis against distilled water with a dialysis membrane (molecular weight cut-off 500). Polyaniline and PAA-PAAm-Azidoaniline at their total weight fraction of 2.5 wt % were mixed with 97.5 wt % formic acid and stirred at 60–80° C. for 24 hours. The formic acid was subsequently evaporated at 80° C., and the mixture was dried in vacuum. The resulting homogenous film was immersed in water to result in a fine dispersion.

Figure 14:
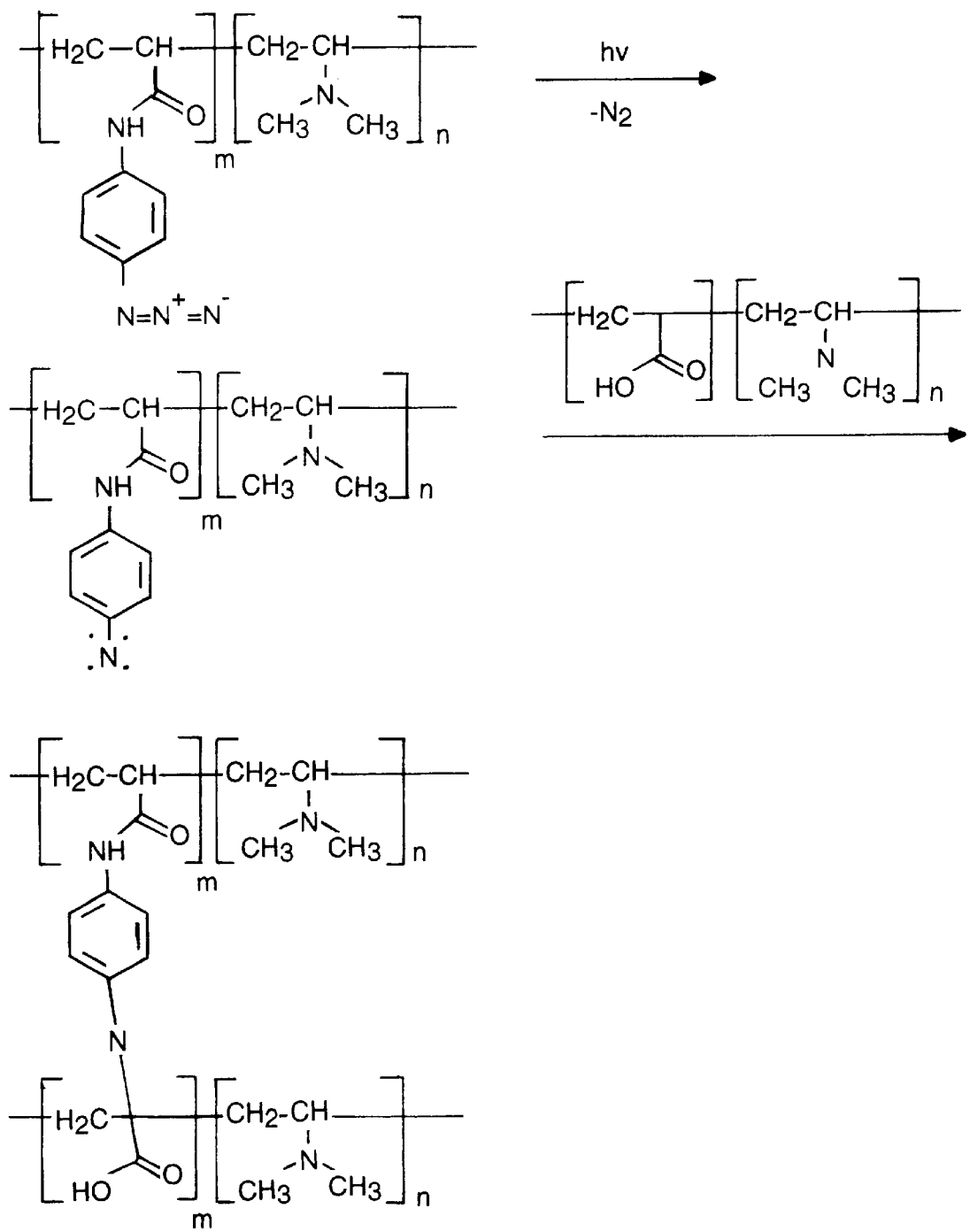
FIG. 14 illustrates the reaction sequence in the photo-crosslinking of one embodiment of a conductive polymer.

The dispersion (PAA-PAAm-Azidoaniline, 30 mg/mL, polyaniline 50 mg/mL, total 0.1 mL) was eluted on a square aluminum plate (a side 15 mm) and air-dried. The plate was then covered with a photomask (quartz plate deposited with chrome) having a prescribed pattern and irradiated for 10 seconds with an ultraviolet lamp of 100 watts from a distance of 5 cm. The power density was 70 mW/cm². Subsequently, the plate was air-dried and immersed in and rinsed with cold distilled water having a temperature of 4° C. The conductive copolymer in the irradiated areas was cross-linked as shown in FIG. 14. The copolymer in other areas was not cross-linked and could be removed by washing with cold distilled water. With the photomask, conductive elastic polymer bumps having a thickness in the range from 10 to 30µ were synthesized. Electrical conductivity of the polymer was measured to be at least about 1 S/cm.

Although in the present example only a monoazide photocross-linking agent is described, other bifunctional azides can be used for photolithography using conductive polymers. Appropriate bifunctional azides are shown in FIG. 15.

The bifunctional azides provided in FIG. 15 will cause grafting of a rubbery elastic material onto a conductive polymer upon UV-irradiation thereby rendering bumps to be more stable and more resistant to scratch. Another example of a suitable photo cross-linker is acrylate esters.

EXAMPLE 5

Figure 16:
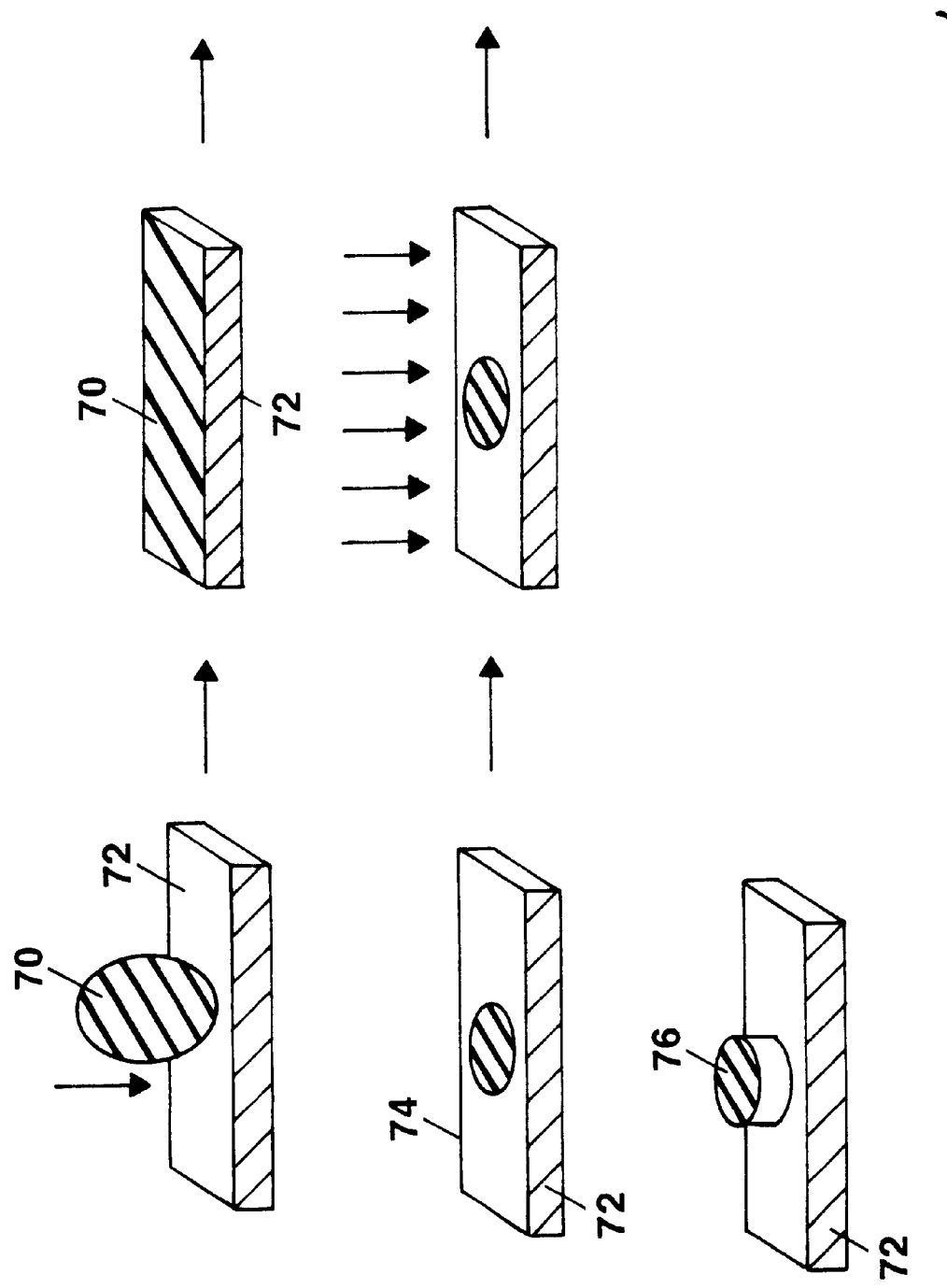
FIG. 16 illustrates a series of steps in one embodiment of a method of manufacturing conductive elastic bumps for an integrated circuit testing apparatus.

In the present example, dispersions 70 of pure conductive polymers, such as polyaniline, polypyrrole, and polythiophene in organic solvents that contain bifunctional photocross-linkable agents are deposited and spread onto solid surfaces 72 as illustrated in FIG. 16. Metals such as iron, steel, stainless steel, and aluminum can be coated non-electrochemically with the polyaniline, polythiophene, or polypyrrole dispersions. In this example, the coating is applied to a pure metal surface, without the need for previous electrochemical, or chemical passivation due to inherent adhesion between the conductive polymer dispersion and the metal surface.

Figure 17:
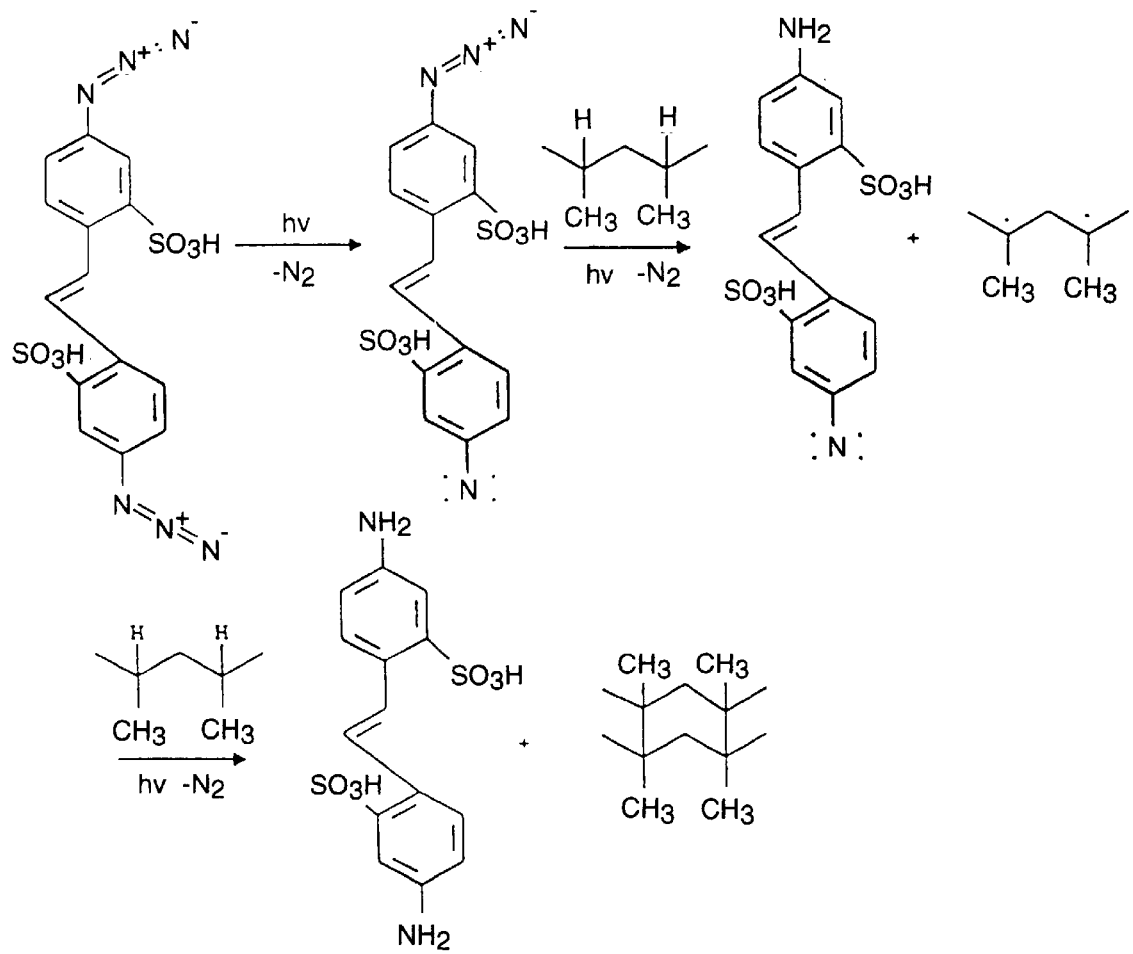
FIG. 17 illustrates the reaction sequence of cross-linking of poly (propylene-co-ethylene) blended with polypyrrole via reaction with diazidostilbenedisulfonic acid.

Polypyrrole powder was synthesized from 0.8 mol/L aqueous pyrrole solution with the ferric ions as an oxidative agent. Polypyrrole was dispersed in isopropyl alcohol/dimethylsulfoxide (1:1 w/w) at 10 w/w % concentration. Poly(propylene-co-ethylene) amorphous copolymer (Aldrich) was added to an effective concentration of 1%. Diazidostilbenedisulfonic acid (DAS) was added to form a 2% solution. The dispersion was eluted on a square aluminum plate having a width of 15 mm and the eluted dispersion air-dried. The plate was prepared before deposition as follows. All roughness of the sample plate was removed with a file and the plate was dry ground with emery cloth (no. 50 and 100), smoothed with emery cloth (no. 100 and 200), and degreased with ethyl acetate. The plate 72 was then covered with a photomask 74 having a prescribed pattern and irradiated for 10 minutes with an ultraviolet lamp from a distance of about 5 cm. Subsequently, the plate 72 was dried at 180° C. and immersed in and rinsed with cold distilled water to form the contact bump 76. The deposition procedure was repeated five times to result in elastic deposits of about 30µ effective thickness. The process involved cross-linking of poly(propylene-co-ethylene) blended with polypyrrole via reaction with diazidostilbenedisulfonic acid as shown in FIG. 17. The electrical conductivity of the deposits was above about 1000 S/cm.

The integrated testing apparatus of the present invention can be manufactured according a variety of methods. In one embodiment, an conductive elastic material is first formed, and then disposed on a lower surface of the PCB to form a plurality of bumps. For example, the conductive elastic material can be screened or stencil printed on the PCB. Alternatively, elastic material can be spun on the PCB and patterned to form the conductive bumps. In one detailed embodiment, the contact bumps are formed using a two step curing process in conjunction with photolithography. According to this method, a partially cured precursor of an conductive elastic material which is viscous is disposed on a surface of the PCB. A plurality of bumps are then patterned over the surface of the PCB using a photolithography step. The bumps subsequently undergo a final curing step. This two step process ensures high placement accuracy and planarity of the bumps.

Figure 18:
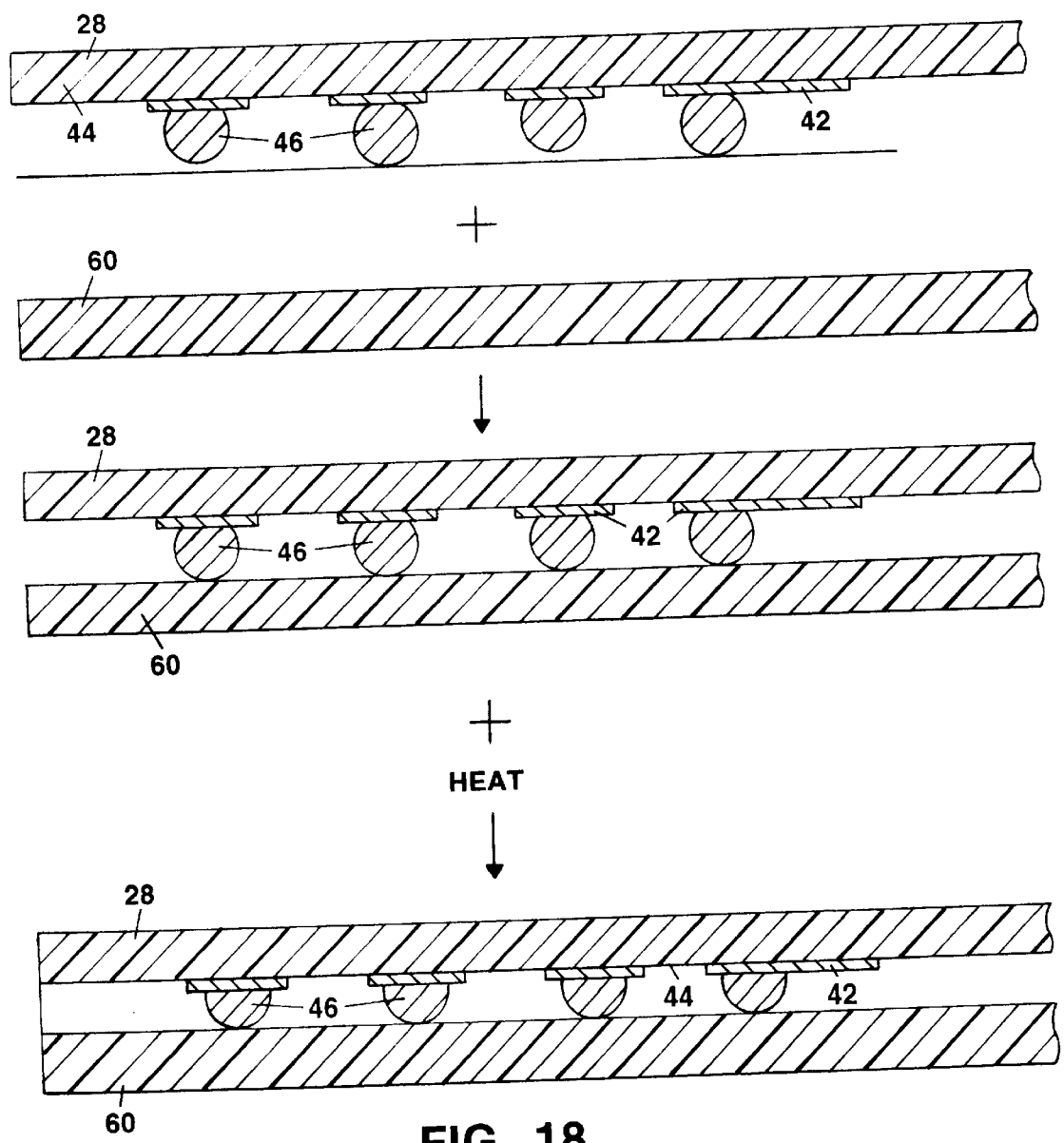
FIG. 18 illustrates a series of steps in one embodiment of a method of manufacturing conductive elastic bumps for an integrated circuit testing apparatus.

Referring to FIG. 18, the conductive bumps 46 are disposed on a lower surface 44 of the probe unit 28, with each bump 46 placed adjacent a microstrip 42. These bumps 46 comprise partially cured conductive elastic polymer. In a preferred embodiment, the bumps 46 have a substantially planar formation to within 30 microns at this stage. Next, a planar surface 60 is pressed against the bumps 46, and the polymer material of the bumps 46 are fully cured by heating to 220° C. while being pressed against a planar surface. The planar surface 60 slightly deforms the bumps to impart a planar surface to each bump. In a preferred embodiment, the bumps 46 have a planar formation to within 2 microns after the planarizing step. In one detailed embodiment, the bumps 46 are substantially elongated when first placed on the probe unit 28, and become substantially spherical during the step of planarizing the bumps. The bumps can become spherical through a diamond.polishing process that is similar to that used in wafer polishing.

In another embodiment, the conductive bumps 46 are polished after the bumps have been formed on the probe unit 28. The bumps 46 can be polished using diamond dust or silver dust, for example. Polishing the bumps 46 planarizes the bumps 46 of different height. In addition, planarizing the bumps 46 with metal dust can enhance conductivity of the bumps 46. Polishing the bumps also roughens their surface to create a granular surface. The granular surface can improve contact by puncturing the native oxide layer or other impeding substance layer on the contact pads of the wafer.

In still another embodiment, the conductive bumps 46 after initial processing undergo a passivation step to remove any unbounded bonds or dangling bonds of the polymer that can trap dust. For example, the bumps can be passivated using a chemical agent such as sulfur or another similar agent.

According to the present invention, the probe unit can have a large number of bumps (i.e., 10,000 or more) so that simultaneous testing of multiple integrated circuits can be achieved. The bumps are also positioned in an array so that the probe unit can contact a wafer having any size or shape of contact pads. In one detailed embodiment, the probe unit include a plurality of embedded active components to multiplex signals from the probe unit to the probe card. By embedding analog multiplex switches which transmit signals between devices on a wafer and the probe card, a larger area of the wafer can be tested without physically lifting and moving the probe unit. The probe unit includes a temperature sensor which records the test temperature. This feature allows testing of devices under different temperature conditions.

Figure 19:
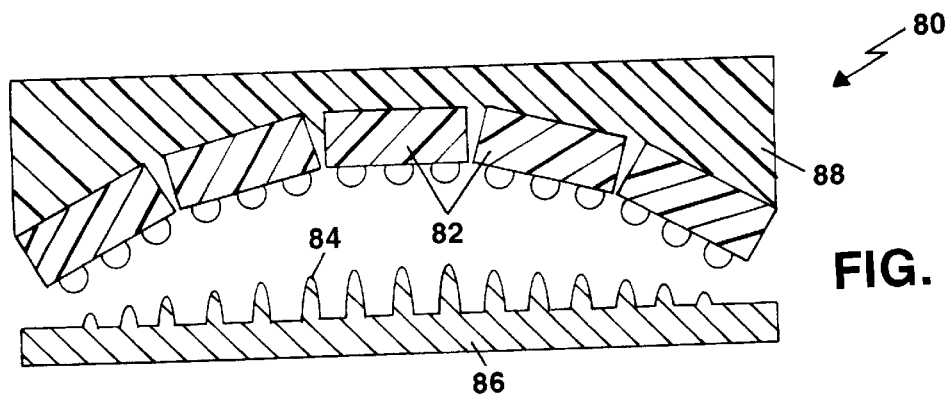
FIG. 19 is a cross-sectional view of an embodiment of an integrated circuit testing apparatus and a wafer having contact pads of varying height.
Figure 20:
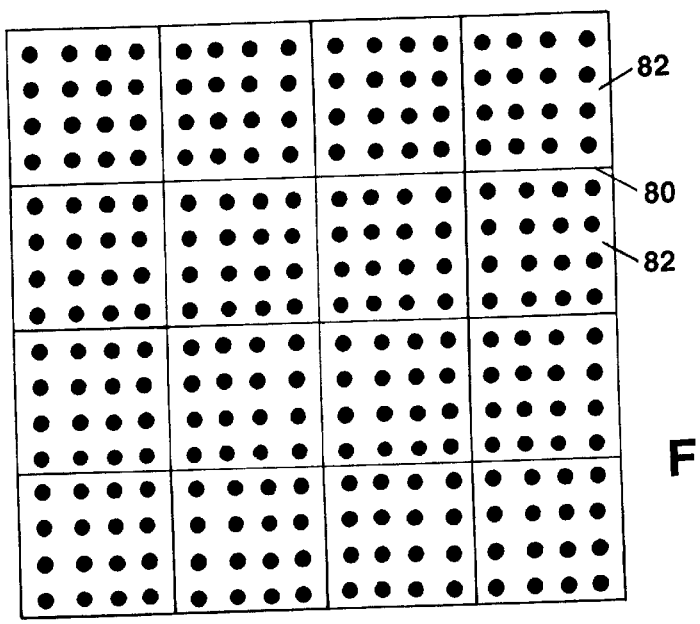
FIG. 20 is a plan view of the apparatus of FIG. 19.
Figure 21:
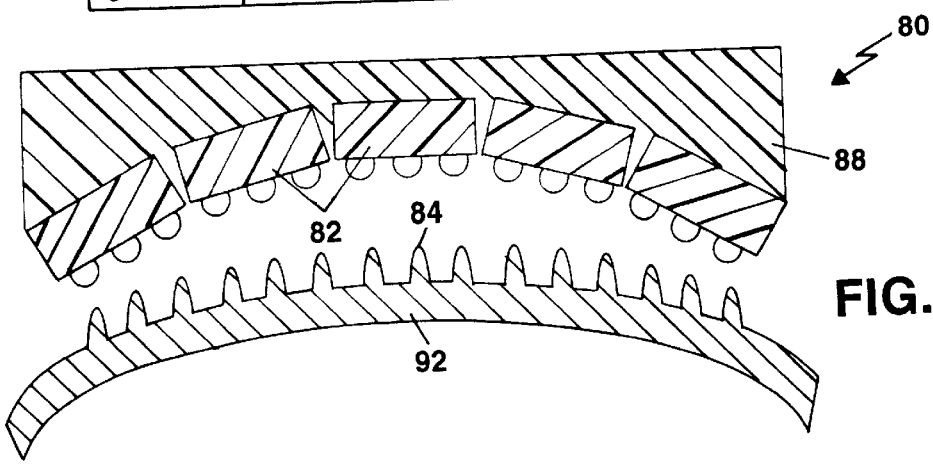
FIG. 21 is a cross-sectional view of an embodiment of an integrated circuit testing apparatus and a deformed wafer.

Referring to FIGS. 19, one embodiment of a probe unit 80 has independently mobile sections 82 which allow each section to move independently to thereby compensate for variations in size and shape of contact pads 84 on a wafer 86 under test. This feature allows the testing apparatus to compensate more completely for height gradients of the wafer surface being tested. Individual sections 82 of the probe unit 80 are connected on back side of the probe unit with a flexible sheet, such as an elastomer 88. The elastomer 88 binds the sections 82 together. FIG. 21 shows that the probe unit 80 with independently mobile sections 82 can accommodate a warped or deformed device 92 being tested. Referring to FIG. 20, the spaces 90 between the mobile sections 82 can be filled with an elastomer to allow more independent movement of each section 82 and to prevent misalignment through lateral displacement upon contact with the wafer.

An integrated circuit can be tested using the testing apparatus of the present invention. To test integrated circuits on a wafer, the contact bumps of the testing apparatus are positioned over the contacts pads on the wafer and brought into contact until the bumps are in good electrical contact with their respective contact pads. Because the contact bumps are elastic, each bump individually deforms to accommodate the size and shape of its corresponding contact pad. The probe unit may further include a flexible member which provides additional compliance of the probe unit. In this manner, uneven height between the contact pads does not prevent good electrical contact between the probe unit and the wafer. The probe unit also does not have to be pushed onto the wafer with much pressure to make electrical contact. The amount of pressure necessary to make good contact between the probe unit and the wafer is from about $0.5 \text{ g}/10,000 \, \mu m^2$ to about $1.0 \text{ g}/10 \, \mu m^2$, and more preferably from about $0.5 \text{ g}/144 \, \mu m^2$ to about $1.0 \text{ g}/144 \, \mu m^2$. The diameter of each bump can range from 10 $\mu$m to 200 $\mu$m. The aspect ratio of each bump can range from 1/3 to 3. The conductive elastic contact bumps also permit repeat testing of the same site without damaging the integrated circuit device due to its compliant nature.

Figure 22A:
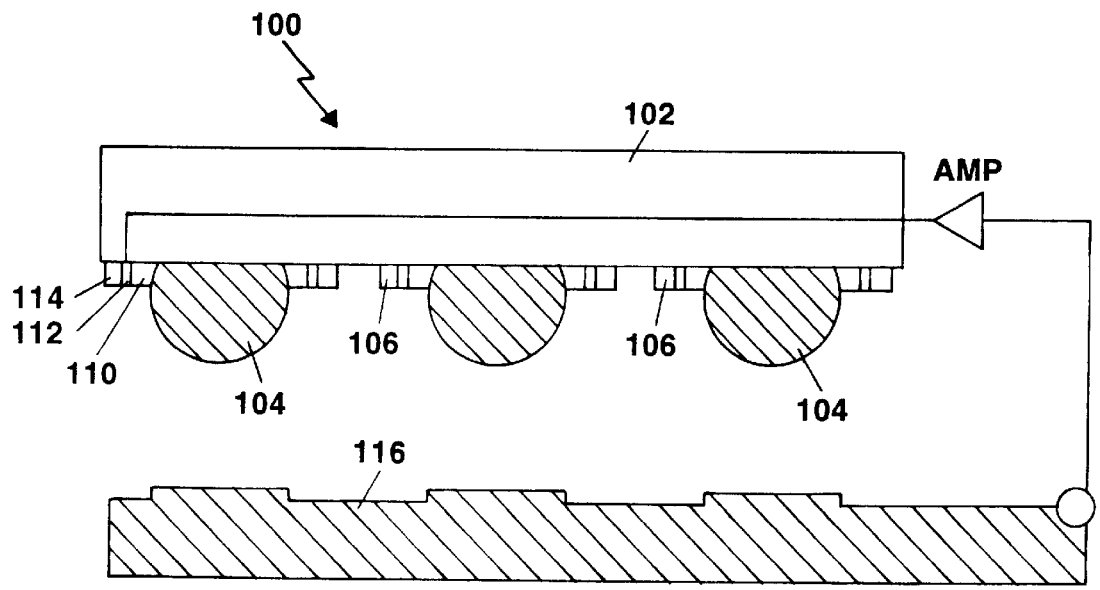
FIG. 22a is a highly schematic cross-sectional view of an embodiment of an integrated circuit testing apparatus.
Figure 22B:
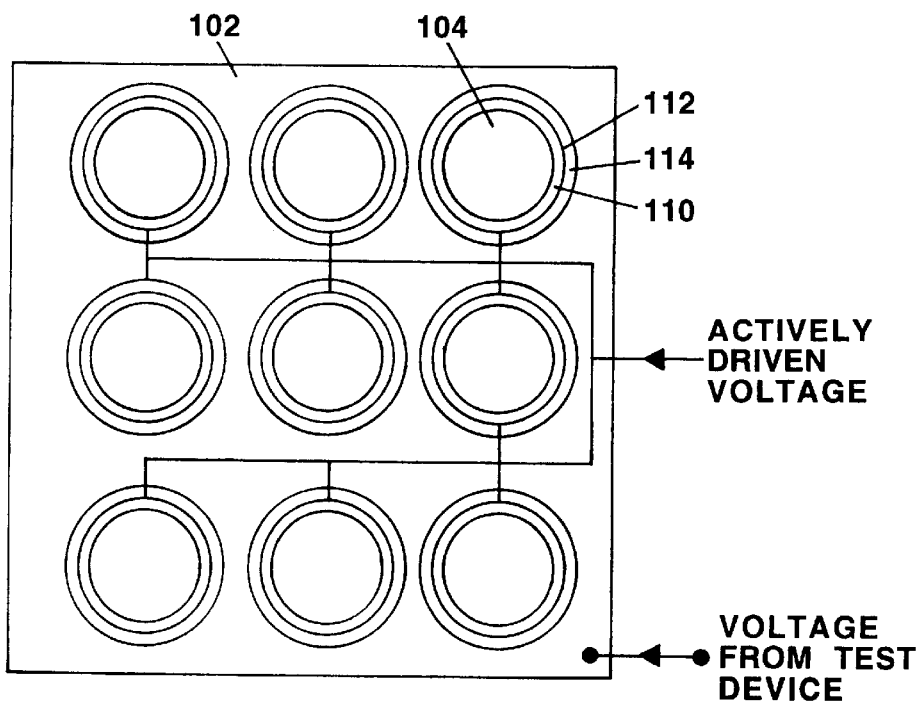

Referring to FIGS. 22a and 22b, the integrated circuit testing apparatus 100 includes a probe unit 102 which has a plurality of contact bumps 104 and a plurality of voltage equilibrating sites 106. Each voltage equilibrating site 106 includes a first dielectric ring 110 surrounding the contact bump 104, a metal ring 112 surrounding the first dielectric ring 110, and a second dielectric ring 114 surrounding the metal ring 112. The testing apparatus 100 reduces electrostatic charge on the probe unit 102. The testing apparatus 100 provides for sensing voltage accumulation on the device 116 being tested and feeding the voltage information to the probe unit 102. The probe unit 102 equalizes the voltage between the probe unit 102 and the device 116 through the voltage equilibrating sites 106 such that static charge does not develop on the probe unit 102.

Figure 23A:
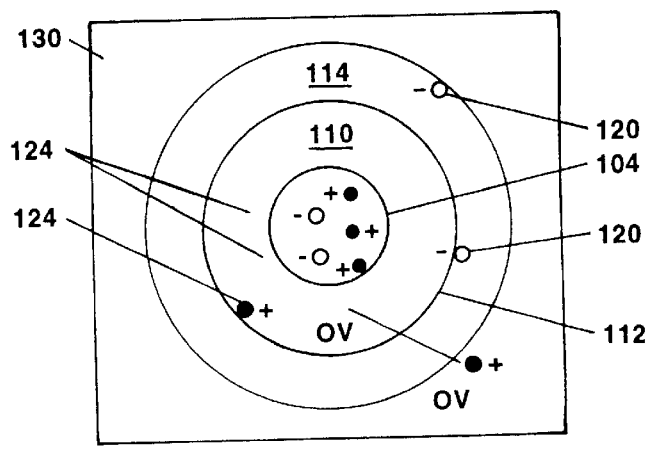
FIGS. 23a–23d illustrate a series of steps of a method for cleaning the contact bumps on the probe unit.
Figure 23B:
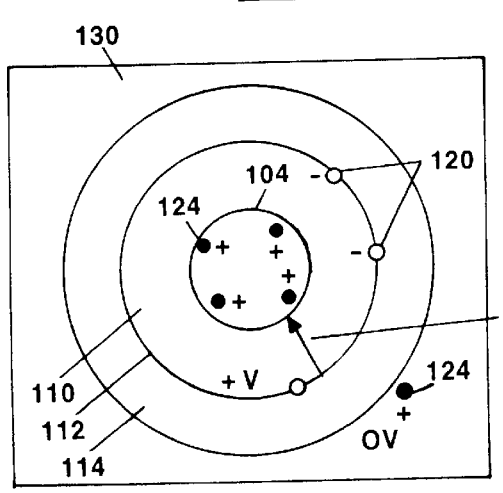
Figure 23C:
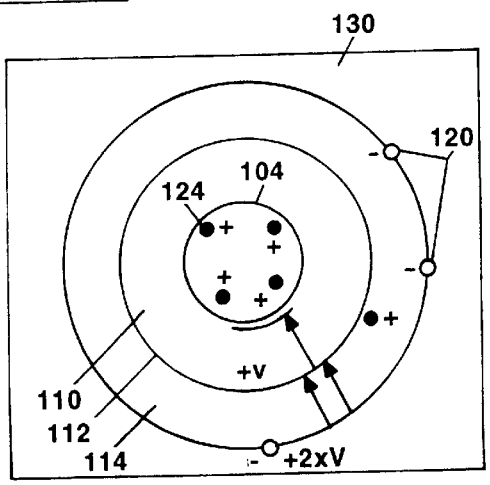
Figure 23D:
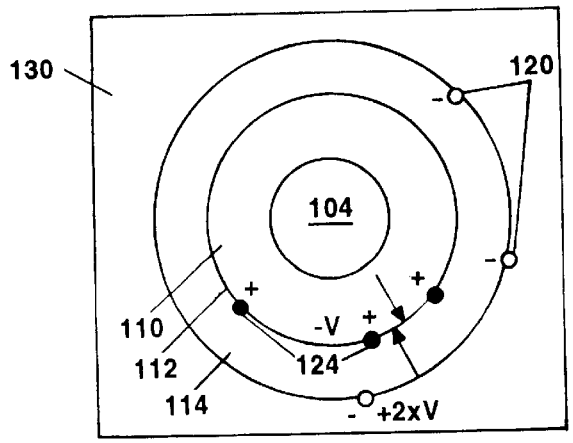

The testing apparatus 100 further provides for surface cleaning of the contact bumps 104 to remove accumulated particles between tests. Referring to FIG. 23a, the probe unit 102 after a test, can include negatively charged particles 120 and positively charged particles 124 in the vicinity of the contact bumps 104. To remove these charged particles 120, 124 from the contact bump 124, a positive voltage is first applied to the metal ring 112 to create an electric field between the bump 104 and the metal ring 112, such that the negatively charged particles 120 are attracted to the metal ring 112, while the positively charged particles 124 are attracted to the contact bump 124. (See FIG. 23b.) A positive voltage that is larger than the positive voltage applied to the metal ring 112 is applied to the stripline 130 to create an electric field between the stripline 130 and the metal ring 112. The negatively charged particles 120 are attracted to the stripline 130 and the positively charged particles existing between the metal ring 112 and the stripline 130 are attracted to the metal ring 112. (See FIG. 23c.) The first two steps remove all negatively charged particles 120 away from the contact bump 104. A negative voltage is applied to the metal ring 112 to create an electric field between the contact bump 104 and the metal ring 112, such that the positively charged particles 124 previously attracted to the contact bump 104 is now attracted to the metal ring 112. (See FIG. 23d.) As a result, all positively charged particles 124 have been removed from the contact bump 104.

Figure 24:
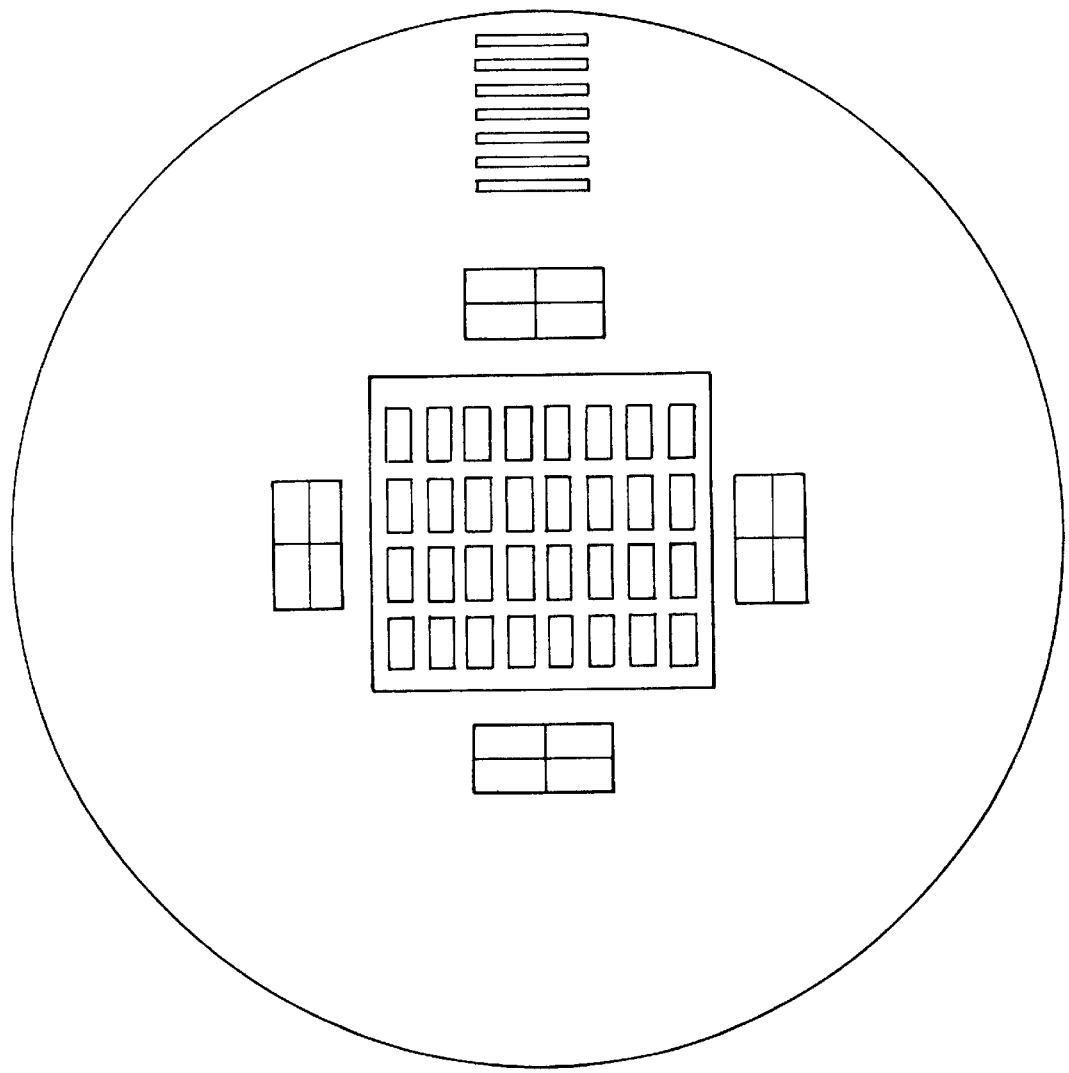
FIG. 24 is a plan view of probe unit with clear window cuts for alignment.

FIG. 24 shows a plan view of a probe unit which includes clear window cuts. The window cuts have cross hair position marks for aligning the contact bumps with the contact pads on a wafer. This configuration allows alignment without pattern recognition lookup optics.

Figure 25:
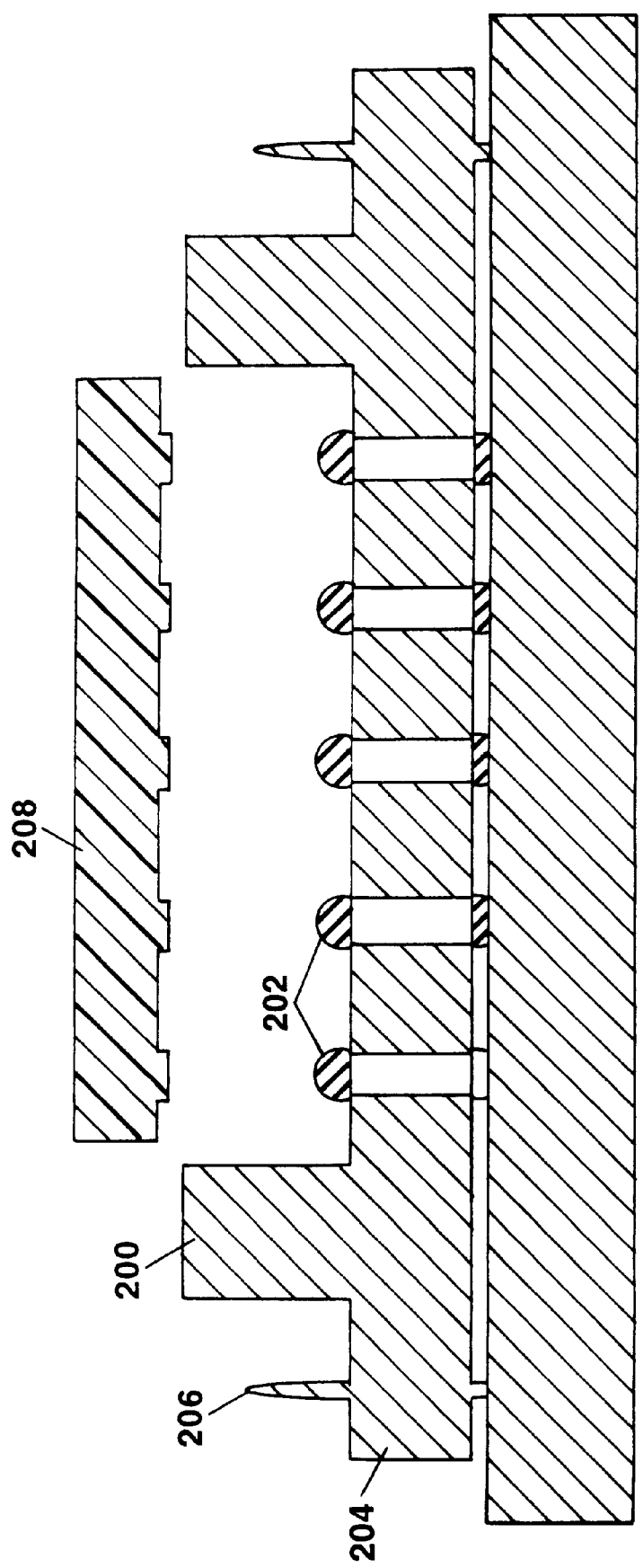
FIG. 25 is a cross-section view of an embodiment of a zero insertion socket.

The invention further features the use of bump technology in conjunction with a minimal force insertion socket. Existing minimal force insertion socket employs devices in packages with leads, which limit its application to perimeter arrays of contacts. The leads add parasitic inductance and capacitance to the signal path, thereby degrading the signal performance and limiting transmission bandwidth. Referring to FIG. 25, a zero force insertion socket 200 comprises a plurality of contact bumps 202 disposed on a surface 204 of the socket 200. The socket 200 can accept either an integrated circuit 208 having area electrical contacts or an area electrical contacts plug. The integrated circuit 208 or the plug is held in place with clips 206 that overlay the integrated circuit 208 or the plug. The mechanism provides the necessary pressure to force electrical contact between the contact bumps 202 of the socket 200 and the integrated circuit 208 or the plug.

-continued

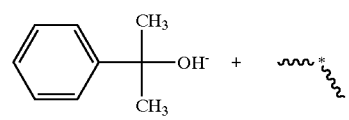

Cross-linking by radical recombination

In a specific example, cis-polysoprene (Mw 38,000) and dicumyl peroxide, both obtained from Aldrich Chemical Co., were mixed with conductive polypyrrole/polyaniline copolymer (Economer 300. Econyx Co.) and silver particles (diameter 1–3μ, Alfa Aesar) in a ratio indicated in the following table.

TABLE

Composition of Conductive Printable Ink.

| Excipient | Source | Function | Wt, g | Wt % |
|---|---|---|---|---|
| cis-Polyisoprene | Natural rubber, av.$M_w$ 38,000 (Aldrich) | Rubber constituent | 3.99 | 48.39 |
| Eeonomer 300 | Polypyrrole/polyaniline (Eeonyx) | Conductive polymer | 1.72 | 20.89 |
| Dicumyl peroxide | [$C_3H_3C(CH_3)_2$]$_2O_2$ (Aldrich) | Rubber cross-linker | 0.82 | 9.94 |
| Silver powder | 1-3μ (Alfa Aesar) | Conductive particle | 1.71 | 20.78 |
| Total | | | 8.24 | 100.00 |

EXAMPLE 6

The present Example concerns with compositions of matter comprising conductive, elastic material printable upon solid supports. Electroconductivity is achieve by incorporating conductive polymers bridging conductive metal particles, into solid rubbers. The said rubbers are obtained by cross-linking of plastics such as cis- or trans-polysoprene, polyisobutylene and the like. The said cross-linking is achieved by radical reactions from decomposition of peroxides, such as dicumyl peroxide, bis-(2,4-diclorobenzoyl)peroxide and the like, followed by hydrogen abstraction from said plastics as depicted in Scheme 12.

Scheme 12
Mechanism of cross-linking by radical reactions of peroxides and plastics Formation of free radicals

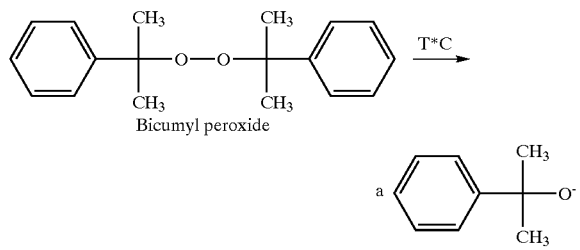

Hydrogen abstraction from a plastic

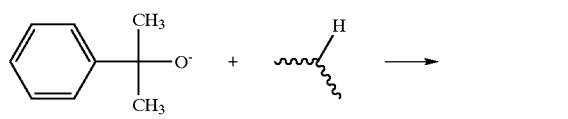

The mixture was diluted by tetrahydrofuran as appropriate and milled using triple roll mill. The resulting mixture appeared to be of a printable ink consistency. It was adherent to metal surfaces. When printed upon aluminum foil and cured at 120° C. for 2 hours, it resulted in elastic bumps fully recoverable after compression. Resistance of the bumps was in the order of 2–homs.

It is understood that the embodiments shown are exemplary and that it is intended to limit the scope of the invention only by the scope of the appended claim.

What is claimed is:

1. An integrated circuit testing apparatus comprising:
    a probe card; and
    a probe unit comprising a plurality of conductive elastomeric bumps and a plurality of conductors positioned to conduct signals from the bumps to said probe card;
    wherein the probe card is in electrical communications with the plurality of conductive elastomeric bumps through a via which extends through a substrate supporting the bumps;
    further comprising a flexible member disposed adjacent the substrate and a flexible conductor disposed within the flexible member for communication with the via.

2. The apparatus of claim 1 wherein the flexible conductor comprises a gold fuzz ball.

3. An integrated circuit testing apparatus comprising:
    a probe card; and
    a probe unit comprising a plurality of conductive elastomeric bumps and a plurality of conductors positioned to conduct signals from the bumps to said probe card;
    wherein the probe,unit further comprises a plurality of ground pads disposed between a plurality of striplines and the bumps, where each stripline is connected to a respective bump;

wherein one of the plurality of striplines forms a laser trimmable flange of a waveguide.

4. An integrated circuit testing apparatus comprising:

a probe card; and a probe unit comprising a plurality of conductive elastomeric bumps and a plurality of conductors positioned to conduct signals from the bumps to said probe card;

further comprising a substrate disposed between the probe card and the probe unit;

wherein the probe unit further comprises one of an active or a passive component embedded within the probe unit.

5. The apparatus of claim 4 wherein the component comprises a capacitor.

6. An integrated circuit testing apparatus comprising:

a probe card; and a probe unit comprising a plurality of conductive bumps and a plurality of conductors positioned to conduct signals from the bumps to said probe card;

wherein the probe card is in electrical communications with the plurality of conductive bumps through a via which extends through a substrate supporting the bumps;

further comprising a flexible member disposed adjacent the substrate and a flexible -conductor disposed within the flexible member for communication with the via.

7. An apparatus as in claim 6 wherein the flexible conductor comprises a gold fuzz ball.

8. An integrated circuit testing apparatus comprising:

a probe card; and a probe unit comprising a plurality of conductive bumps and a plurality of conductors, including striplines, positioned to conduct signals from the bumps to said probe card;

wherein the probe unit further comprises a plurality of ground pads disposed between a plurality of striplines and the bumps, where each stripline is connected to a respective bump;

wherein at least one of the plurality of striplines forms a laser trimmable flange of a waveguide.

9. An integrated circuit testing apparatus comprising:

a probe card; and a probe unit comprising a plurality of conductive bumps, and a plurality of muti-layed waveguides, with laser trimmable flanges which permit tuneabillty, to conduct signals to said conductive bumps.

10. An integrated circuit testing apparatus comprising:

a probe card; and a probe unit comprising a plurality of conductive bumps and a plurality of conductors positioned to conduct signals from the bumps to said probe card;

further comprising.a substrate disposed between the probe card and the probe unit;

wherein the probe unit further comprises one of an active or a passive component embedded within the probe unit.

11. An apparatus as in claim 10 wherein said component is embedded within the probe unit between the substrate and the interconnecting conductors of the probe unit.

12. An apparatus as in claim 10 wherein said component is a capacitor.

13. An apparatus as in claim 10 wherein said component is a multiplexer.

14. An integrated circuit testing apparatus comprising:

a probe card; and a probe unit comprising a plurality of conductive bumps and a plurality of conductors positioned to conduct signals from the bumps to said probe card;

further comprising a substrate disposed between the probe card and the probe unit;

wherein the probe unit further comprises:

an active or a passive component mounted on the probe unit; and an elastomeric layer between said passive component and said probe card to compensate for surface variations caused by component.

15. An integrated circuit testing apparatus comprising:

a probe card; and a probe unit comprising a plurality independently mobile sections, each comprised of at least one contact bump;

a flexible member supporting the plurality of said sections, so as to allow each section to move independently to compensate for differences of height of circuitry being tested.

16. An apparatus as in claim 15 wherein the flexible member is an elastomeric sheet.

17. An apparatus as in claim 15 wherein the bumps are made a conductive elastomeric material.

18. An integrated circuit testing apparatus comprising:

a probe card;

a probe unit including:

a plurality of conductive contact bumps; and a plurality of voltage equilibrating sites around each of the plurality of bumps, each equilibrating site including:

a first conductor encircling an associated contact bump;

a conductor for supplying voltage to the first conductor separately from voltage supplied to the contact bump;

circuitry for sensing the static voltage on a device to be tested by contact with said probe unit and for placing a corresponding voltage on said first conductors.

19. An apparatus as in claim 18 further including a dielectric material placed between said contact bump and said first conductor.

20. An apparatus as in claim 18 wherein:

said contact bump is round; and said first conductor is a metal ring.

21. An apparatus as in claim 18 wherein said contact bump is made of a conductive elastomeric material.

22. An apparatus as in claim 18 wherein:

said equilibrating sites each further include:

a second conductor on said probe unit encircling said first conductor; and a conductor for supplying voltage to the second conductor separately from voltage applied to the contact first conductor; and said apparatus further includes circuitry for applying a sequence of different combinations of voltages to said first and second conductor so as electrostatically draw first dust particles of one charge and then dust particles of the other charge from said contact bumps.

23. An apparatus as in claim 22 further including a dielectric material placed between said first conductor and said second conductor.

24. An integrated circuit testing apparatus comprising:
a probe card; and
a probe unit comprising a plurality of conductive bumps and a plurality of conductors positioned to conduct signals from the bumps to said probe card;
wherein said contact bumps have been polished with diamond dust.

25. An apparatus as in claim 24 wherein said bumps are made of conductive elastomeric material.

26. An integrated circuit testing apparatus comprising:
a probe card; and
a probe unit comprising a plurality of conductive bumps and a plurality of conductors positioned to conduct signals from the bumps to said probe card;
wherein said contact bumps have been polished with silver dust.

27. An apparatus as in claim 26 wherein said bumps are made of conductive elastomeric material.

28. An integrated circuit testing apparatus comprising:
a probe card; and
a probe unit comprising a plurality of conductive elastomeric bumps and a plurality of conductors positioned to conduct signals from the bumps to said probe card;
wherein said elastomeric bumps have been passivated to remove unbound bonds or dangling bonds.

29. An apparatus as in claim 28 wherein said passivation has been performed with sulfur.

* * * * *